United States Patent
Shimomura et al.

(10) Patent No.: US 8,048,754 B2
(45) Date of Patent: Nov. 1, 2011

(54) METHOD FOR MANUFACTURING SOI SUBSTRATE AND METHOD FOR MANUFACTURING SINGLE CRYSTAL SEMICONDUCTOR LAYER

(75) Inventors: Akihisa Shimomura, Atsugi (JP); Fumito Isaka, Zama (JP); Sho Kato, Ebina (JP); Takashi Hirose, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 118 days.

(21) Appl. No.: 12/564,973

(22) Filed: Sep. 23, 2009

(65) Prior Publication Data
US 2010/0081254 A1  Apr. 1, 2010

(30) Foreign Application Priority Data
Sep. 29, 2008  (JP) .................... 2008-250114

(51) Int. Cl.
*H01L 21/8222* (2006.01)
*H01L 21/331* (2006.01)

(52) U.S. Cl. ........ 438/311; 438/692; 438/663; 438/706; 438/745; 257/E21.042; 257/E21.043; 257/E21.077; 257/E21.17; 257/E21.32; 257/E21.134; 257/E21.229; 257/E21.304; 257/E21.267; 257/E21.327; 257/E21.328; 257/E21.329; 257/E21.332

(58) Field of Classification Search .......... 438/149, 438/311, 509, 513, 514, 474, 475, 663, 680, 438/687, 688, 692, 712, 733, 745, 769, 752, 438/753; 257/E21.17, 32, 42, 43, 77, 134, 257/229, 304, 267, 327, 328, 329, 332
See application file for complete search history.

(56) References Cited

U.S. PATENT DOCUMENTS
5,374,564 A  12/1994  Bruel
(Continued)

FOREIGN PATENT DOCUMENTS
EP  0 553 852  8/1993
(Continued)

OTHER PUBLICATIONS

Dross et al., "Stress-Induced Lift-Off Method for Kerf-Loss-Free Wafering of Ultra-Thin (~50μm) Crystalline Si Wafers," Proceeding of 33$^{rd}$ IEEE PVSC, 2008, 5 pages.

*Primary Examiner* — David Nhu
(74) *Attorney, Agent, or Firm* — Eric J. Robinson; Robinson Intellectual Property Law Office, P.C.

(57) ABSTRACT

An object is to provide a single crystal semiconductor layer with extremely favorable characteristics without performing CMP treatment or heat treatment at high temperature. Further, an object is to provide a semiconductor substrate (or an SOI substrate) having the above single crystal semiconductor layer. A first single crystal semiconductor layer is formed by a vapor-phase epitaxial growth method on a surface of a second single crystal semiconductor layer over a substrate; the first single crystal semiconductor layer and a base substrate are bonded to each other with an insulating layer interposed therebetween; and the first single crystal semiconductor layer and the second single crystal semiconductor layer are separated from each other at an interface therebetween so as to provide the first single crystal semiconductor layer over the base substrate with the insulating layer interposed therebetween. Thus, an SOI substrate can be manufactured.

16 Claims, 11 Drawing Sheets

U.S. PATENT DOCUMENTS

| | | | |
|---|---|---|---|
| 5,869,387 A * | 2/1999 | Sato et al. | 438/459 |
| 6,121,117 A | 9/2000 | Sato et al. | |
| 6,251,754 B1 | 6/2001 | Ohshima et al. | |
| 6,335,231 B1 * | 1/2002 | Yamazaki et al. | 438/151 |
| 6,534,380 B1 * | 3/2003 | Yamauchi et al. | 438/455 |
| RE39,484 E | 2/2007 | Bruel | |
| 7,781,308 B2 * | 8/2010 | Isaka et al. | 438/458 |
| 7,790,563 B2 * | 9/2010 | Kakehata | 438/311 |
| 2009/0042362 A1 | 2/2009 | Moriwaka | |
| 2009/0142904 A1 | 6/2009 | Isaka et al. | |
| 2009/0197392 A1 | 8/2009 | Isaka et al. | |
| 2010/0129948 A1 | 5/2010 | Isaka et al. | |

FOREIGN PATENT DOCUMENTS

| | | |
|---|---|---|
| EP | 1 043 768 | 10/2000 |
| EP | 1 251 556 | 10/2002 |
| JP | 05-211128 | 8/1993 |
| JP | 05-217821 | 8/1993 |
| JP | 09-260619 | 10/1997 |
| JP | 10-093122 | 4/1998 |
| JP | 10-321548 | 12/1998 |
| JP | 11-097379 | 4/1999 |
| JP | 2000-030993 | 1/2000 |
| JP | 2003-017671 | 1/2003 |

* cited by examiner

FIG. 4A
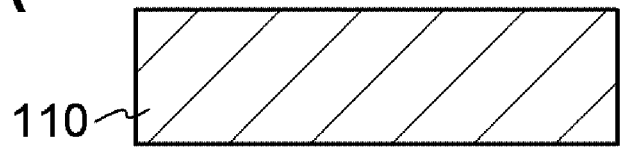
FIG. 4B
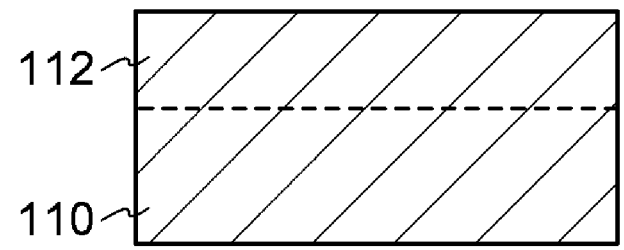
FIG. 4C
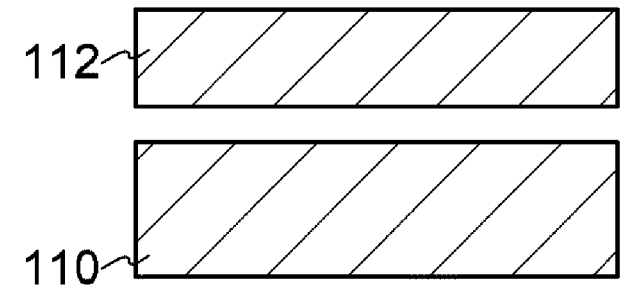
FIG. 4D
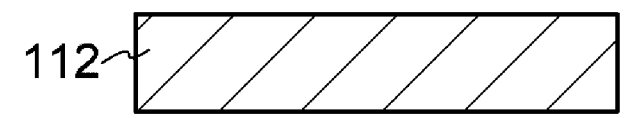

540  542  544  546

520  516  508     526  518  510

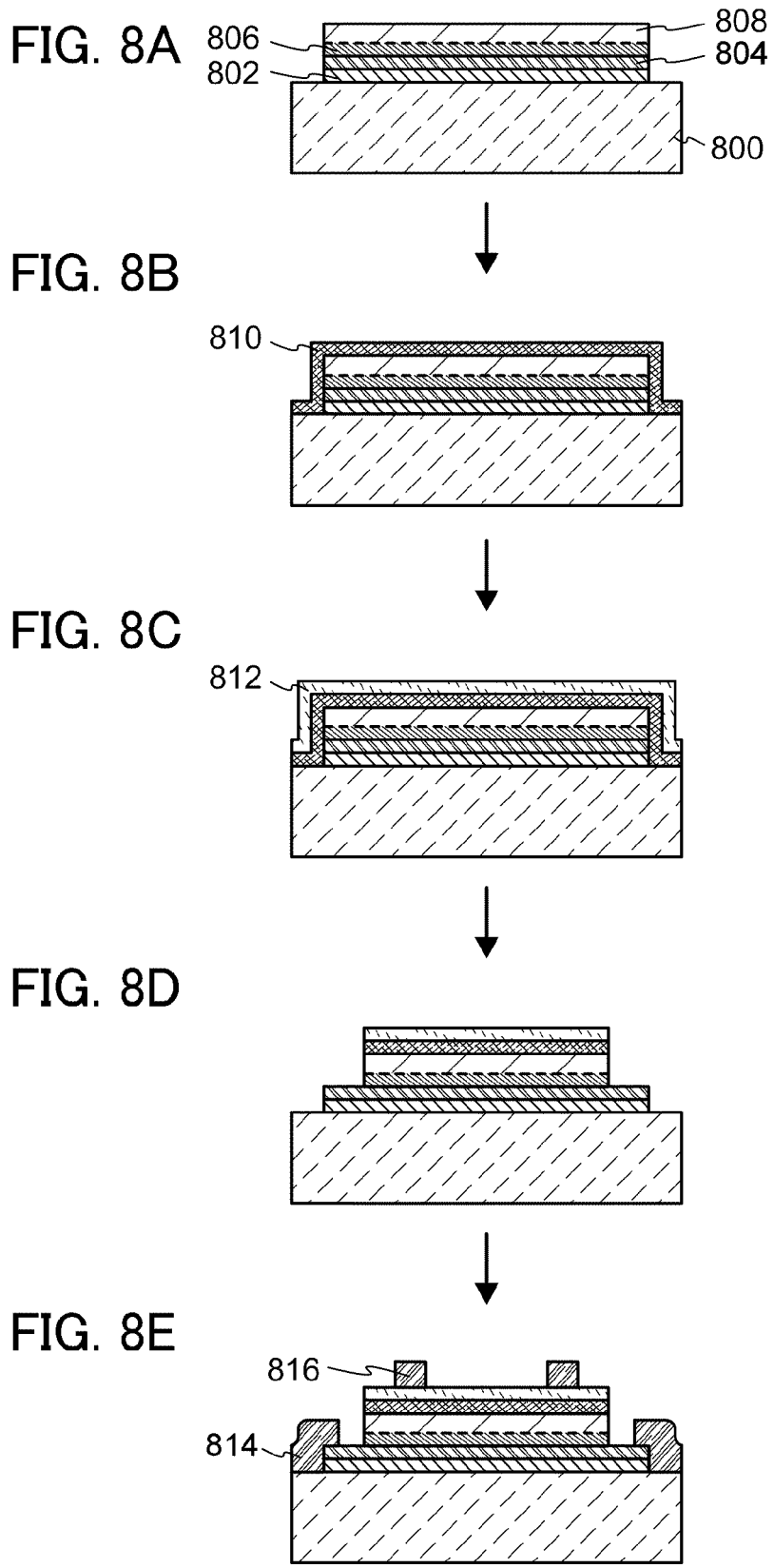

FIG. 9A
FIG. 9B
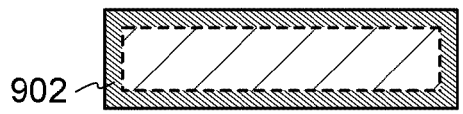
FIG. 9C
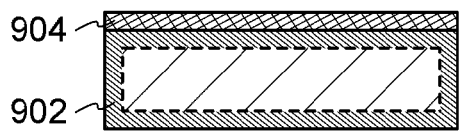
FIG. 9D
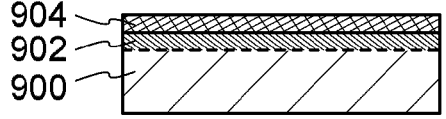
FIG. 9E
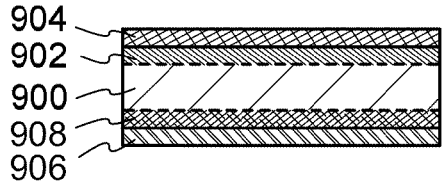
FIG. 9F
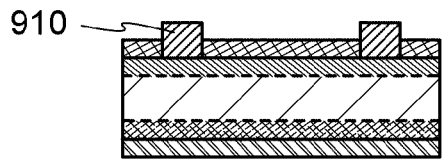

METHOD FOR MANUFACTURING SOI SUBSTRATE AND METHOD FOR MANUFACTURING SINGLE CRYSTAL SEMICONDUCTOR LAYER

BACKGROUND OF THE INVENTION

1. Field of the Invention

The present invention relates to a method for manufacturing a single crystal semiconductor layer. In specific, the present invention relates to a method for manufacturing a single crystal semiconductor layer over a substrate with an insulating layer interposed therebetween, that is, relates to a method for manufacturing an SOI (silicon on insulator) substrate.

2. Description of the Related Art

In recent years, an integrated circuit using an SOI (silicon on insulator) substrate in which a thin single crystal semiconductor layer is formed on an insulating surface, instead of a bulk silicon wafer, has been researched. An SOI substrate enables parasitic capacitance generated by a drain of a transistor and a semiconductor substrate to be small. Therefore, an SOI substrate has greatly attracted attention for its ability to improve performance of a semiconductor integrated circuit.

The Smart Cut (registered trademark) method is known as one of methods for manufacturing an SOI substrate (for example, see Patent Document 1). An outline of a method for manufacturing an SOI substrate by the Smart Cut (registered trademark) method is described below. First, hydrogen ions are implanted into a silicon wafer by an ion implantation method for forming a microbubble layer at a predetermined depth from the surface. Then, the silicon wafer into which the hydrogen ions are implanted is bonded to another silicon wafer with a silicon oxide film interposed therebetween. After that, heat treatment is performed so that a part of the silicon wafer into which the hydrogen ions are implanted is separated in a thin film shape at the microbubble layer. Accordingly, a single crystal silicon layer is provided over the other bonded silicon wafer. The Smart Cut (registered trademark) method may be referred to as a hydrogen ion implantation separation method.

As another method for manufacturing an SOI substrate, a method called ELTRAN is known (for example, see Patent Document 2). According to ELTRAN, a single crystal silicon layer is provided over a silicon wafer as follows: a silicon wafer is anodized so as to form a porous silicon layer; a single crystal silicon layer is formed on the porous silicon layer by an epitaxial growth method; a thermal oxidation film is formed over the single crystal silicon layer; the silicon wafer is bonded to another silicon wafer; and the single crystal silicon layer is separated at the porous silicon layer by etching or water jetting or the like.

Note that in these methods, CMP treatment or heat treatment at high temperature (about lower than or equal to 1200° C.) needs to be performed after a single crystal silicon layer is formed so that the planarity of the surface of the single crystal silicon layer is improved and a defect in the single crystal silicon layer is repaired.

[Citation List]

[Patent Document 1] Japanese Published Patent Application No. H05-211128

[Patent Document 2] Japanese Published Patent Application No. H05-217821

SUMMARY OF THE INVENTION

In the case where a single crystal semiconductor layer is formed by the above-described method, CMP treatment or heat treatment at high temperature is needed; therefore, it is difficult to provide an inexpensive large-sized semiconductor substrate (SOI substrate). For example, it is practically suggested that a glass substrate should be used as a substrate to which a single crystal semiconductor layer is bonded (hereinafter the substrate is referred to as a base substrate) in order to realize a large-sized semiconductor substrate (SOI substrate). However, a glass substrate does not satisfy the above requirement in terms of its heat resistance. In addition, CMP treatment is a surface-polishing treatment, which has high difficulty in performing uniform treatment on a large area.

In view of the above problems, an object of an embodiment of the present invention disclosed is to provide a single crystal semiconductor layer with favorable characteristics without performing CMP treatment or heat treatment at high temperature. Another object is to provide a semiconductor substrate (or an SOI substrate) having the above single crystal semiconductor layer.

According to an embodiment of the present invention disclosed, a single crystal semiconductor layer is formed on a single crystal semiconductor substrate by a vapor-phase epitaxial growth method. In this case, the single crystal semiconductor layer is formed under a condition by which the single crystal semiconductor layer has high compressive stress. Accordingly, the single crystal semiconductor layer can be separated at an interface between the single crystal semiconductor substrate and the single crystal semiconductor layer. A vapor-phase epitaxial growth method here refers to a method for growing a crystal with the atom alignment of a base crystal or the like remained, whose material is a gas.

A method for manufacturing an SOI substrate, which is one embodiment of the present invention disclosed comprises the following steps: a first single crystal semiconductor layer is formed by a vapor-phase epitaxial growth method on a surface of a second single crystal semiconductor layer over a substrate; the first single crystal semiconductor layer and a base substrate are bonded to each other with an insulating layer interposed therebetween; and the first single crystal semiconductor layer and the second single crystal semiconductor layer are separated from each other at an interface therebetween so as to provide the first single crystal semiconductor layer over the base substrate with the insulating layer interposed therebetween.

A method for manufacturing an SOI substrate, which is another embodiment of the present invention disclosed comprises the following steps: a single crystal semiconductor layer is formed by a vapor-phase epitaxial growth method on a surface of a single crystal semiconductor substrate; the single crystal semiconductor layer and a base substrate are bonded to each other with an insulating layer interposed therebetween; and the single crystal semiconductor substrate and the single crystal semiconductor layer are separated from each other at an interface therebetween so as to provide the single crystal semiconductor layer over the base substrate with the insulating layer interposed therebetween.

In the aforementioned structures, a single crystal silicon substrate can be used as the single crystal semiconductor substrate, and a single crystal silicon layer can be formed as the single crystal semiconductor layer formed by the vapor-phase epitaxial growth method. The single crystal silicon layer is formed by the vapor-phase epitaxial growth method using a mixed gas of a silane based gas and hydrogen as a source gas, and in the source gas, a flow rate of hydrogen is preferably greater than or equal to 4 times and less than or equal to 10 times (more preferably greater than or equal to 5 times and less than or equal to 7 times) that of the silane based gas.

Further, in the aforementioned structure, a glass substrate is preferably used as the base substrate.

A method for manufacturing a single crystal semiconductor layer, which is one embodiment of the present invention disclosed comprises the following steps: a single crystal semiconductor layer is formed by a vapor-phase epitaxial growth method on the surface of a single crystal semiconductor substrate; a material containing a metal is applied to the single crystal semiconductor layer to form a metal layer after the single crystal semiconductor substrate and the single crystal semiconductor layer formed by the vapor-phase epitaxial growth method are heated to maintain a predetermined temperature; the single crystal semiconductor substrate and the single crystal semiconductor layer are separated from each other at an interface therebetween by cooling the single crystal semiconductor substrate, the single crystal semiconductor layer, and the metal layer so as to form a stacked-layer structure including the metal layer and the single crystal semiconductor layer; and the metal layer is removed from the single crystal semiconductor layer.

In the aforementioned structure, a single crystal silicon substrate can be used as the single crystal semiconductor substrate, and a single crystal silicon layer can be formed as the single crystal semiconductor layer formed by the vapor-phase epitaxial growth method. The single crystal silicon layer is formed by the vapor-phase epitaxial growth method using a mixed gas of a silane based gas and hydrogen as a source gas, and in the source gas, a flow rate of hydrogen is preferably greater than or equal to 4 times and less than or equal to 10 times (more preferably greater than or equal to 5 times and less than or equal to 7 times) that of the silane based gas. In addition, a material containing aluminum or copper is preferably used as the above-described material containing a metal.

Note that in this specification, a "single crystal" refers to, concerning certain crystal axes, a crystal in which the crystal axes are aligned in the same direction in any part of a sample and also in which a crystal boundary does not exist between crystals. Note also that, in this specification, the single crystal includes a crystal in which the direction of the crystal axes is uniform as described above and which has no crystal boundaries, even when it includes a crystal defect or a dangling bond. In addition, re-single-crystallization of a single crystal semiconductor layer means that a semiconductor layer having a single crystal structure returns to have a single crystal structure after being in a different state from the single crystal structure (for example, a liquid-phase state). Or, it can be said that re-single-crystallization of a single crystal semiconductor layer means that a single crystal semiconductor layer is recrystallized to form a single crystal semiconductor layer.

Note that a semiconductor device in this specification indicates any device capable of functioning by utilizing semiconductor characteristics, and electro-optic devices, semiconductor circuits, and electronic devices are all semiconductor devices.

In addition, in this specification, a display device includes in its category a light-emitting device and a liquid crystal display device. The light-emitting device includes a light-emitting element, and the liquid crystal display device includes a liquid crystal element. The light-emitting element includes in its category an element whose luminance is controlled by a current or a voltage, and specifically includes an inorganic electroluminescent (EL) element, an organic EL element, and the like.

According to an embodiment of the present invention disclosed, a single crystal semiconductor layer formed by a vapor-phase epitaxial growth method is separated from a single crystal semiconductor substrate by utilizing the stress of the single crystal semiconductor layer. Thus, a defect or the like does not occur in the single crystal semiconductor layer itself, which means that heat treatment at high temperature is unnecessary. In addition, the single crystal semiconductor layer after being separated has high planarity; therefore, planarization treatment such as CMP treatment is not needed. Accordingly, the present invention makes it easy to realize a large-sized semiconductor substrate (SOI substrate).

Further, according to an embodiment of the present invention disclosed, since a method is employed in which a single crystal semiconductor layer formed by a vapor-phase epitaxial growth method is separated at an interface with a single crystal semiconductor substrate, the thickness of the single crystal semiconductor substrate itself is not reduced and the single crystal semiconductor substrate can be repeatedly used.

BRIEF DESCRIPTION OF THE DRAWINGS

FIGS. 4A to 4D are cross-sectional views of another example of a method for manufacturing a single crystal semiconductor layer of the present invention.

FIGS. 8A to 8E are cross-sectional views of an example of a method for manufacturing a photoelectric conversion device.

FIGS. 9A to 9F are cross-sectional views of another example of a method for manufacturing a photoelectric conversion device.

DETAILED DESCRIPTION OF THE INVENTION

Figure 1A:
FIGS. 1A to 1F are cross-sectional views of an example of a method for manufacturing a semiconductor substrate of the present invention.

Hereinafter, embodiments and an example of the present invention will be described with reference to accompanying drawings. Note that the present invention can be implemented in various different modes and it will be readily appreciated by those skilled in the art that modifications of modes and details are possible without departing from the spirit and the scope of the present invention. Therefore, the present invention should not be interpreted as being limited to the description of the embodiments and the example. Note that in all the drawings for describing the embodiments and the example, the same portions or portions having the similar functions are denoted by the same reference numerals, and repeated descriptions thereof are omitted.

Embodiment 1

In this embodiment, an example of a method for manufacturing a semiconductor substrate (SOI substrate) will be described with reference to drawings. Specifically, the case of manufacturing a semiconductor substrate in which a single crystal semiconductor layer is provided over a base substrate will be described.

Figure 1B:
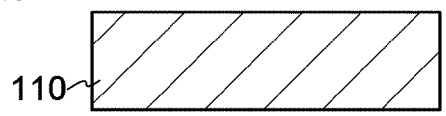

First, a base substrate 100 and a single crystal semiconductor substrate 110 are prepared (see FIGS. 1A and 1B).

As the base substrate 100, a substrate made of an insulator can be used. In specific, a variety of glass substrates that are used in the electronics industry, such as an aluminosilicate glass substrate, an aluminoborosilicate glass substrate, and a barium borosilicate glass substrate; a quartz substrate; a ceramic substrate; and a sapphire substrate can be used. Note that the heat resistance of the above-described glass substrates is generally improved by containing a large amount of boric acid ($B_2O_3$); and a more-practical heat-resistant glass substrate can be provided by containing a larger amount of barium oxide (BaO) than boric acid. Therefore, it is preferable that a glass substrate containing more BaO than $B_2O_3$ be used. Alternatively, a single crystal semiconductor substrate (for example, a single crystal silicon substrate) may be used as the base substrate 100. In this embodiment, the case of using a glass substrate as the base substrate 100 is described. Cost reduction can be achieved when an inexpensive glass substrate that can have a larger size is used as the base substrate 100.

It is preferable that the surface of the base substrate 100 be cleaned in advance. Specifically, ultrasonic cleaning is performed on the base substrate 100 by using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Through such cleaning treatment, the planarity of the surface of the base substrate 100 can be improved and abrasive particles left on the surface of the base substrate 100 can be removed.

As the single crystal semiconductor substrate 110, for example, a single crystal semiconductor substrate formed using an element belonging to Group 14 of the periodic table, such as a single crystal silicon substrate, a single crystal germanium substrate, a single crystal silicon germanium substrate, or the like can be used. Alternatively, a compound single crystal semiconductor substrate such as a gallium arsenide substrate, an indium phosphide substrate, or the like can be used. The typical sizes of commercial silicon substrates are 5 inches (125 mm) in diameter, 6 inches (150 mm) in diameter, 8 inches (200 mm) in diameter, 12 inches (300 mm) in diameter, and 16 inches (400 mm) in diameter, and the typical shape thereof is circular. Note that the shape of the single crystal semiconductor substrate 110 is not limited to circular, and the single crystal semiconductor substrate 110 processed into, for example, a rectangular shape or the like can be used. Note that the single crystal semiconductor substrate 110 can be manufactured by a CZ method or a FZ (Floating Zone) method.

Note that an embodiment of the present invention disclosed utilizes the crystallinity or the planarity of the surface of the single crystal semiconductor substrate 110. Therefore, not only the above-described substrates but also any substrate whose surface has almost the same or substantially the same characteristics as that of a single crystal semiconductor substrate can be used. For example, a substrate (such as a so-called SOI substrate) having a structure in which a single crystal semiconductor layer is provided over a glass substrate, a quartz substrate, a silicon substrate, or the like with an insulating layer interposed therebetween may be used.

Figure 1C:
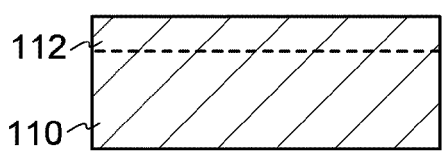

Next, a single crystal semiconductor layer 112 is formed on the single crystal semiconductor substrate 110 by a vapor-phase epitaxial growth method (see FIG. 1C).

The single crystal semiconductor layer 112 may be formed using the same material as that of the single crystal semiconductor substrate 110. In the case of forming a single crystal silicon layer, for example, it can be formed by a vapor-phase growth method (including a CVD method) using a mixed gas of a silane based gas (a gas containing silicon hydride, typically monosilane or disilane) and hydrogen as a source gas.

In the source gas used in the above vapor-phase epitaxial growth, hydrogen is contained at a flow rate of greater than or equal to 4 times and less than or equal to 10 times (preferably, greater than or equal to 5 times and less than or equal to 7 times) that of the silane based gas. In other words, the dilution ratio of hydrogen to the silane based gas (hydrogen/silane based gas) is set to be greater than or equal to 4 and less than or equal to 10, or preferably greater than or equal to 5 and less than or equal to 7. The silane based gas is typified by silane; alternatively, disilane ($Si_2H_6$) or the like can be used. Further, a rare gas may be added to the source gas.

As a plasma CVD apparatus used for the epitaxial growth, a high-frequency (RF) plasma CVD apparatus with an electric power frequency of greater than or equal to 10 MHz and less than or equal to 200 MHz, typically of 13.56 MHz or 60 MHz, or a microwave plasma CVD apparatus with an electric power frequency of greater than or equal to 1 GHz and less than or equal to 5 GHz, typically of 2.45 GHz, or the like can be used.

A condition for the vapor-phase epitaxial growth by which the single crystal semiconductor layer 112 has high compressive stress can be determined as appropriate. As an example, a mixed gas of silane and hydrogen may be used as a source gas, and the following condition may be applied: the flow rate (sccm) of silane and hydrogen, $SiH_4:H_2$ is 25 (sccm):150 (sccm); the temperature of the substrate 280° C.; the output electric power of the high-frequency power source 30 W; and the electric power frequency 27 MHz. The single crystal semiconductor layer 112 which is formed under the above conditions, especially with the above flow rate, has high compressive stress and is easy to be separated at an interface with the single crystal semiconductor substrate 110. Note that in the case where the temperature of the substrate at the time of film deposition is around higher than or equal to 200° C. and lower than or equal to 300° C., the single crystal semiconductor layer 112 can be obtained to be favorable and with a small number of defects. In addition, time taken for the film deposition can be reduced and the crystallinity thereof can be improved by increasing the total flow rate of the source gas.

The thickness of the single crystal semiconductor layer 112 may be set to be a needed thickness. However, note that, as the thickness of the single crystal semiconductor layer 112 is increased, it becomes easier to separate the single crystal semiconductor layer 112 at the interface with the single crystal semiconductor substrate 110 because the compressive stress tends to be increased. For example, the single crystal semiconductor layer 112 may be formed to have a thickness of around greater than or equal to 100 nm and less than or equal to 10 μm.

Note that before forming the single crystal semiconductor layer 112 by the epitaxial growth, it is necessary to remove a native oxide film or the like formed over the surface of the single crystal semiconductor substrate 110. This is because when an oxide film or the like exists on the surface of the single crystal semiconductor substrate 110, the epitaxial growth does not proceed. Such an oxide film can be removed using a solution containing fluorinated acid. Specifically, treatment may be performed using fluorinated acid (or dilute hydrofluoric acid) until the surface of the single crystal semiconductor substrate 110 exhibits a water repellent property. Note that it is preferable that the surface of the single crystal semiconductor substrate 110 be cleaned using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contamination for a similar reason.

Figure 1D:
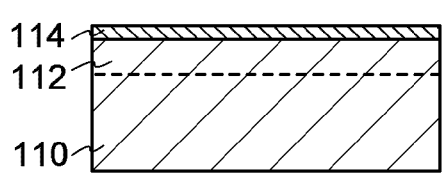

Next, an insulating layer 114 is formed over the single crystal semiconductor layer 112 (see FIG. 1D). The insulating layer 114 can be formed to have a single layer or stacked layers of an insulating layer such as a silicon oxide film, a silicon oxynitride film, a silicon nitride film, a silicon nitride oxide film, or the like. These films can be formed by a thermal oxidation method, a CVD method, a sputtering method, or the like.

Note that in this specification, silicon oxynitride refers to the one that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide refers to the one that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. Note that the above-described ranges are the ranges when silicon oxynitride and silicon nitride oxide are measured using Rutherford backscattering spectrometry (RBS) or hydrogen forward scattering spectrometry (HFS). In addition, the total for the content ratio of the constituent elements does not exceed 100 atomic %.

When the semiconductor substrate according to this embodiment is utilized for an application such as solar cells, which needs a lower electrode, the insulating layer 114 may be formed after a conductive layer which serves as an electrode is formed over the single crystal semiconductor layer 112. Further, addition of an impurity may be performed on the single crystal semiconductor layer 112 before the conductive layer or the insulating layer 114 is formed.

Figure 1E:
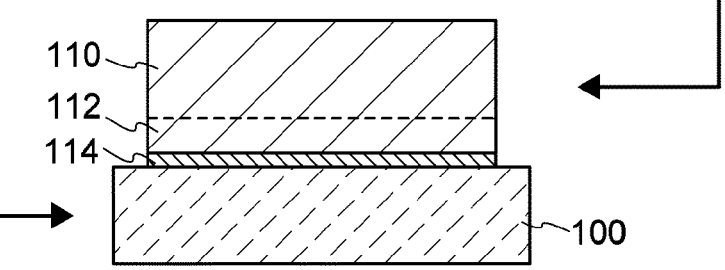
Figure 1F:
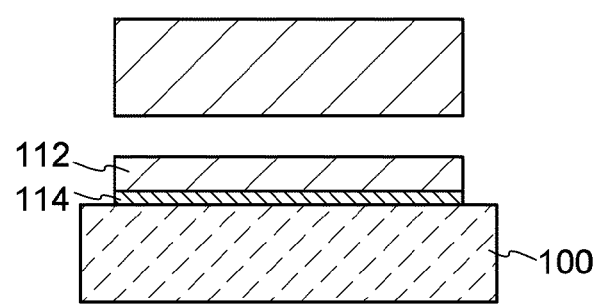

Then, the base substrate 100 and the single crystal semiconductor substrate 110 are bonded to each other with the insulating layer 114 interposed therebetween (see FIG. 1E). After that, the single crystal semiconductor layer 112 is separated at the interface with the single crystal semiconductor substrate 110, whereby the single crystal semiconductor layer 112 is provided over the base substrate 100 (see FIG. 1F). As a method of the separation, a dynamical method using a substrate separation apparatus or the like (a method in which the layer is simply taken off) can be employed. Alternatively, for example, water jetting may be performed, in which separation at the interface between the single crystal semiconductor layer 112 and the single crystal semiconductor substrate 110 is promoted.

Note that heat treatment for increasing the bonding strength may be performed after the base substrate 100 and the insulating layer 114 are bonded to each other. Temperature of the heat treatment can be set as appropriate; however, in the case where the heat treatment is performed at high temperature (for example, higher than or equal to 600° C.), the bonding of the single crystal semiconductor substrate 110 and the single crystal semiconductor layer 112 is strengthened, which sometimes makes separation thereof at the interface difficult. For the above heat treatment, a diffusion furnace, a heating furnace such as a resistance heating furnace, a rapid thermal annealing (RTA) apparatus, a microwave heating apparatus, or the like can be used.

Through the above steps, a semiconductor substrate (SOI substrate) having extremely favorable characteristics can be obtained.

Although not shown in this embodiment, laser beam irradiation may be performed on the single crystal semiconductor layer 112 which is obtained through the above steps. As a result of this, the number of the defects in the single crystal semiconductor layer 112 can be reduced and the planarity of the surface thereof can be improved. Heat treatment may be performed on the single crystal semiconductor layer 112 in order to reduce the number of the defects.

Further, treatment for thinning the single crystal semiconductor layer 112 or treatment for further improving the planarity may be performed. As the treatment, one of dry etching or wet etching, or etching in which dry etching and wet etching are combined can be used.

According to an embodiment of the present invention disclosed, a single crystal semiconductor layer formed by a vapor-phase epitaxial growth method is separated from a single crystal semiconductor substrate by utilizing the stress of the single crystal semiconductor layer. Thus, a defect or the like does not occur in the single crystal semiconductor layer itself, which means that heat treatment at high temperature is not needed. In addition, the single crystal semiconductor layer after being separated has high planarity; therefore, planarization treatment such as CMP treatment is not needed. Accordingly, an embodiment of the present invention disclosed makes it possible to provide a large-sized semiconductor substrate (SOI substrate) having favorable characteristics.

Further, according to an embodiment of the present invention disclosed, since the method is employed in which the single crystal semiconductor layer formed by the vapor-phase epitaxial growth method is separated at an interface with the single crystal semiconductor substrate, the thickness of the single crystal semiconductor substrate itself is not reduced and the single crystal semiconductor substrate can be repeatedly used.

The structure described in this embodiment can be implemented by being combined as appropriate with structures described in the other embodiments or an example in this specification.

Embodiment 2

This embodiment will describe another example of a method for manufacturing a semiconductor substrate (SOI substrate) with reference to drawings.

Figure 2A:
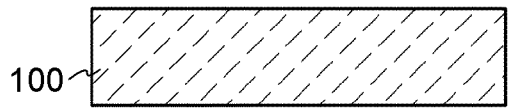
FIGS. 2A to 2G are cross-sectional views of another example of a method for manufacturing a semiconductor substrate of the present invention.

First, a base substrate 100 is prepared (see FIG. 2A). A detailed description of the base substrate 100 is omitted here because Embodiment 1 can be referred to.

Figure 2B:
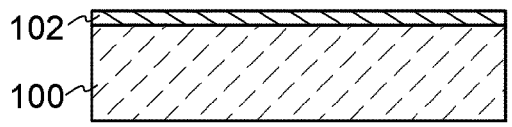

Next, a nitrogen-containing layer 102 (for example, an insulating film containing nitrogen such as a silicon nitride film ($SiN_x$) or a silicon nitride oxide film ($SiN_xO_y$) (x>y)) is formed on the surface of the base substrate 100 (see FIG. 2B).

In this embodiment, the nitrogen-containing layer 102 serves as a layer (bonding layer) which is to be attached to a single crystal semiconductor layer afterwards. In addition, the nitrogen-containing layer 102 also functions as a barrier layer for preventing an impurity such as Na (sodium) contained in the base substrate from diffusing into the single crystal semiconductor layer.

As described above, since the nitrogen-containing layer 102 serves as the bonding layer in this embodiment, it is preferable that the surface of the nitrogen-containing layer 102 be formed to have a certain level of planarity. Specifically, the nitrogen-containing layer 102 is formed to have a surface with an average surface roughness ($R_a$) of less than or equal to 0.5 nm and a root-mean-square surface roughness ($R_{ms}$) of less than or equal to 0.60 nm, more preferably, an average surface roughness of less than or equal to 0.35 nm and a root-mean-square surface roughness of less than or equal to 0.45 nm. The thickness is preferably in the range of greater than or equal to 10 nm and less than or equal to 200 nm, more preferably, in the range of greater than or equal to 50 nm and less than or equal to 100 nm. By improving the planarity of the surface as described above, a defect in bonding to the single crystal semiconductor layer can be prevented.

Figure 2C:
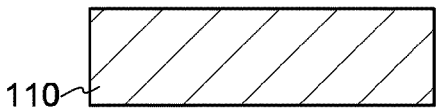

Next, a single crystal semiconductor substrate 110 is prepared (see FIG. 2C). Note that in this embodiment, a structure is employed in which the above step related to the base substrate 100 precedes a step described below which is related to the single crystal semiconductor substrate 110, for convenience of the description; however, an embodiment of the present invention disclosed is not interpreted as being limited to this order. In addition, a detailed description of the single crystal semiconductor substrate 110 is omitted here because Embodiment 1 can be referred to.

Figure 2D:
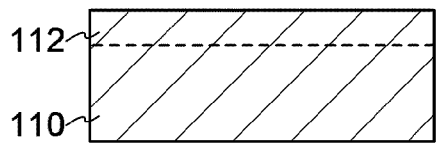

Next, a single crystal semiconductor layer 112 is formed on the single crystal semiconductor substrate 110 by a vapor-phase epitaxial growth method (see FIG. 2D).

In the case where a single crystal silicon layer is formed as the above-described single crystal semiconductor layer 112, for example, it can be formed by a vapor-phase growth method (including a CVD method or the like) using a mixed gas of a silane based gas (typically silane) and hydrogen as a source gas. The description of Embodiment 1 can be referred to for details of a method for manufacturing the single crystal semiconductor layer 112; therefore, the description thereof is omitted here.

Figure 2E:
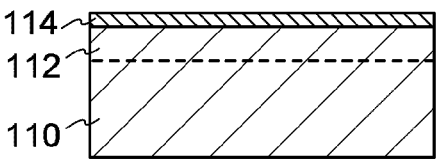

Next, an insulating layer 114 is formed over the single crystal semiconductor layer 112 (see FIG. 2E).

The insulating layer 114 can be formed to have a single layer or stacked layers of a silicon oxide film, a silicon oxynitride film, or the like. A thermal oxidation method, a CVD method, a sputtering method, or the like can be employed to manufacture the insulating layer 114. Further, in the case where the insulating layer 114 is formed by a CVD method, it is preferable in terms of productivity that a silicon oxide film be formed using organosilane such as tetraethoxysilane (abbreviation: TEOS) (chemical formula: $Si(OC_2H_5)_4$).

In this embodiment, a silicon oxide film is formed as the insulating layer 114 by using organosilane.

Note that in the case where the insulating layer 114 is formed by a thermal oxidation method, oxidation in an oxidation atmosphere to which halogen is added is preferably performed. For example, the thermal oxidation treatment is performed on the single crystal semiconductor layer 112 in an oxidation atmosphere to which chlorine (Cl) is added, whereby the insulating layer 114 is formed through chlorine oxidation. In this case, the insulating layer 114 contains chlorine atoms.

Halogen atoms such as the chlorine atoms form distortions in the insulating layer 114. As a result, absorption of moisture into the insulating layer 114 is improved and diffusion rate of moisture is increased. That is, when moisture is present on the surface of the insulating layer 114, the moisture present on the surface of the insulating layer 114 can be rapidly absorbed and diffused into the insulating layer 114. In addition, when the halogen atoms are contained in the insulating layer 114, a heavy metal (such as Fe, Cr, Ni, or Mo), which is an extrinsic impurity, is captured in the insulating layer 114; thus, contamination of the single crystal semiconductor layer 112 can be prevented. Further, after the single crystal semiconductor substrate is bonded to the base substrate 100, an impurity such as Na diffused from the base substrate 100 is fixed in the insulating layer 114; thus, contamination of the single crystal semiconductor layer 112 can be prevented.

When the semiconductor substrate according to this embodiment is utilized for an application such as solar cells, which needs a lower electrode, the insulating layer 114 may be formed after a conductive layer which serves as an electrode is formed over the single crystal semiconductor layer 112. Further, addition of an impurity may be performed on the single crystal semiconductor layer 112 before the conductive layer or the insulating layer 114 is formed.

Figure 2F:
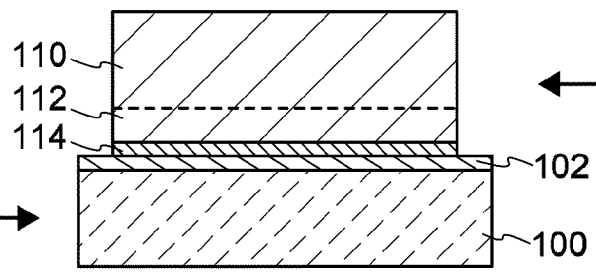

Subsequently, the surface of the base substrate 100 and the surface of the single crystal semiconductor substrate 110 are disposed to face each other so that the surface of the nitrogen-containing layer 102 and the surface of the insulating layer 114 are bonded to each other (see FIG. 2F).

Here, after the base substrate 100 and the single crystal semiconductor substrate 110 are disposed in close contact with each other with the nitrogen-containing layer 102 and the insulating layer 114 interposed therebetween, a pressure in the range of greater than or equal to 1 $N/cm^2$ and less than or equal to 500 $N/cm^2$, preferably, in the range of greater than or equal to 11 $N/cm^2$ and less than or equal to 20 $N/cm^2$, is applied to one portion of the single crystal semiconductor substrate 110. Accordingly, a bonding between the nitrogen-containing layer 102 and the insulating layer 114 begins at the pressed portion and then a spontaneous bonding proceeds throughout the entire area. This bonding step is performed by Van der Waals force or hydrogen bonding and can be performed at room temperature.

Note that it is preferable that surface treatment be performed on the insulating layer 114 formed over the single crystal semiconductor substrate 110 and the nitrogen-containing layer 102 formed on the base substrate 100 before the base substrate 100 and the single crystal semiconductor substrate 110 are bonded to each other. As the surface treatment, plasma treatment, ozone treatment, megasonic cleaning, two-fluid cleaning (a method of spraying functional water such as pure water or hydrogen-containing water with a carrier gas such as nitrogen), or combination thereof can be employed. Specifically, plasma treatment may be performed on a surface of at least one of the nitrogen-containing layer 102 and the insulating layer 114, and then, ozone treatment, megasonic cleaning, two-fluid cleaning or the like may be performed, whereby dust such as an organic substance on the surface of the nitrogen-containing layer 102 and the insulating layer 114 can be removed and the surfaces can be made hydrophilic. As a result, bonding strength between the nitrogen-containing layer 102 and the insulating layer 114 can be increased.

Here, an example of ozone treatment is described. For example, ozone treatment can be performed on a surface of an object to be processed by irradiation with ultraviolet (UV) light in an atmosphere containing oxygen. Ozone treatment in which ultraviolet irradiation is performed in an atmosphere containing oxygen is also called UV ozone treatment, ultraviolet ozone treatment, or the like. In an atmosphere containing oxygen, irradiation with ultraviolet light having a wavelength of less than 200 nm and ultraviolet light having a wavelength of greater than or equal to 200 nm is performed, whereby ozone can be generated and singlet oxygen can be generated from the ozone. Irradiation with ultraviolet light having a wavelength of less than 180 nm is performed, whereby ozone can also be generated and singlet oxygen can be generated from the ozone.

Examples of reactions which occur by performing irradiation with ultraviolet light having a wavelength of less than 200 nm and ultraviolet light having a wavelength of greater than or equal to 200 nm in an atmosphere containing oxygen are described below.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with ultraviolet light (hv) having a wavelength ($\lambda_1$ nm) of less than 200 nm in an atmosphere containing oxygen ($O_2$) is performed to generate an oxygen atom ($O(^3P)$) in a ground state. Next, in the reaction formula (2), the oxygen atom ($O(^3P)$) in a ground state and the oxygen ($O_2$) react with each other to generate ozone ($O_3$). Then, in the reaction formula (3), irradiation with ultraviolet light having a wavelength ($\lambda_2$ nm) of greater than or equal to 200 nm in an atmosphere containing the generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to decompose the ozone, whereby singlet oxygen is generated. The ozone treatment as described above can be performed, for example, by irradiation with light of a low-pressure mercury lamp ($\lambda_1$=185 nm, $\lambda_2$=254 nm) in an atmosphere containing oxygen.

In addition, examples of reactions which occur by performing irradiation with ultraviolet light having a wavelength of less than 180 nm in an atmosphere containing oxygen are described below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), the oxygen atom ($O(^3P)$) in a ground state and the oxygen ($O_2$) react with each other to generate ozone ($O_3$). In the reaction formula (6), irradiation with ultraviolet light having a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing the ozone or oxygen. The ozone treatment as described above can be performed, for example, by irradiation with light of a Xe excimer UV lamp ($\lambda_3$=172 nm) in an atmosphere containing oxygen.

Ultraviolet light having a wavelength of less than 200 nm cuts chemical bonding of an organic substance attached to the surface of the object to be processed or the like, whereby the organic substance attached to the surface of the object to be processed, the organic substance whose chemical bonding is cut, or the like can be removed by oxidative decomposition by the ozone or the singlet oxygen generated from the ozone. By performing the ozone treatment as described above, a hydrophilicity and purity of the surface of the object to be processed can be increased, and bonding can be favorably performed.

Ozone is generated by performing irradiation with ultraviolet light in an atmosphere containing oxygen. The ozone is effective in removal of the organic substance attached to the surface of the object to be processed. In addition, singlet oxygen is as effective as or even more effective than the ozone in removal of the organic substance attached to the surface of the object to be processed. Ozone and singlet oxygen are examples of oxygen in an active state, and are collectively called active oxygen. As described with the above reaction formulae and the like, there are reactions where ozone is generated in generating singlet oxygen or singlet oxygen is generated from the ozone; therefore, reactions where singlet oxygen contributes are also called ozone treatment here for convenience.

Heat treatment for increasing the bonding strength may be performed after the hydrogen-containing layer 102 and the insulating layer 114 are bonded to each other. Temperature of the heat treatment can be set as appropriate; however, in the case where the heat treatment is performed at high temperature (for example, higher than or equal to 600° C.), the bonding of the single crystal semiconductor substrate 110 and the single crystal semiconductor layer 112 is strengthened, which sometimes makes separation thereof at the interface difficult. For the above heat treatment, a diffusion furnace, a heating furnace such as a resistance heating furnace, a rapid thermal annealing (RTA) apparatus, a microwave heating apparatus, or the like can be used.

Figure 2G:
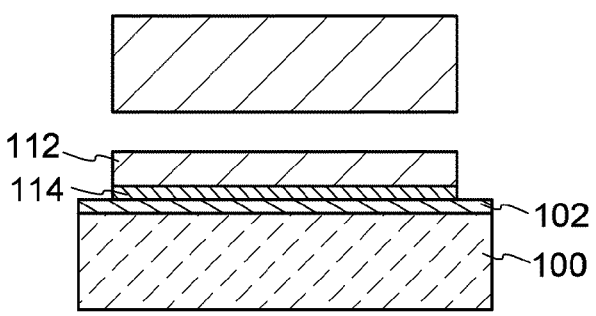

After that, the single crystal semiconductor layer 112 is separated at the interface with the single crystal semiconductor substrate 110, whereby the single crystal semiconductor layer 112 is left over the base substrate 100 (see FIG. 2G). As a method of the separation, a dynamical method using a substrate separation apparatus or the like (a method in which the layer is simply taken off) can be employed. Alternatively, for example, water jetting may be performed, in which separation at the interface between the single crystal semiconductor layer 112 and the single crystal semiconductor substrate 110 is promoted.

Through the above steps, a semiconductor substrate (SOI substrate) having extremely favorable characteristics can be obtained.

Although not shown in this embodiment, laser beam irradiation may be performed on the single crystal semiconductor layer 112 which is obtained through the above steps. As a result of this, the number of the defects in the single crystal semiconductor layer 112 can be reduced and the planarity of the surface thereof can be improved. Heat treatment may be performed on the single crystal semiconductor layer 112 in order to reduce the number of the defects.

Further, treatment for thinning the single crystal semiconductor layer 112 or treatment for further improving the planarity may be performed. As the treatment, one of dry etching or wet etching, or etching in which dry etching and wet etching are combined can be used.

According to an embodiment of the present invention disclosed, a single crystal semiconductor layer formed by a vapor-phase epitaxial growth method is separated from a single crystal semiconductor substrate by utilizing the stress of the single crystal semiconductor layer. Thus, a defect or the like does not occur in the single crystal semiconductor layer itself, which means that heat treatment at high temperature is not needed. In addition, the single crystal semiconductor layer after being separated has high planarity; therefore, planarization treatment such as CMP treatment is not needed. Accordingly, an embodiment of the present invention disclosed makes it possible to provide a large-sized semiconductor substrate (SOI substrate) having favorable characteristics.

Further, according to an embodiment of the present invention disclosed, since the method is employed in which the single crystal semiconductor layer formed by the vapor-phase epitaxial growth method is separated at an interface with the single crystal semiconductor substrate, the thickness of the single crystal semiconductor substrate itself is not reduced and the single crystal semiconductor substrate can be repeatedly used.

The structure described in this embodiment can be implemented by being combined as appropriate with structures described in the other embodiments or an example in this specification.

Embodiment 3

This embodiment will describe an example of a method for manufacturing a single crystal semiconductor layer, which is another embodiment of the present invention disclosed with reference to drawings. Note that the method for manufacturing the semiconductor substrate according to Embodiment 1 or 2 is applied to the method for manufacturing the single crystal semiconductor layer according to this embodiment.

Figure 3A:
FIGS. 3A to 3E are cross-sectional views of an example of a method for manufacturing a single crystal semiconductor layer of the present invention.

First, a single crystal semiconductor substrate 110 is prepared (see FIG. 3A). A detailed description of the single crystal semiconductor substrate 110 is omitted here because Embodiment 1 and the like can be referred to.

Figure 3B:
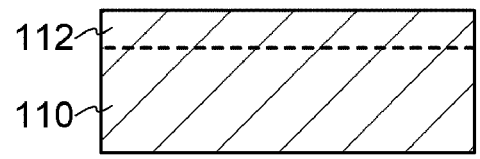

Next, a single crystal semiconductor layer 112 is formed on the single crystal semiconductor substrate 110 by a vapor-phase epitaxial growth method (see FIG. 3B). Embodiment 1 and the like can be referred to also for details of the method for manufacturing the single crystal semiconductor layer 112.

Figure 3C:
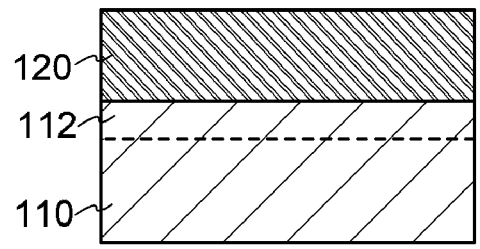

Subsequently, the single crystal semiconductor substrate 110 and the single crystal semiconductor layer 112 are heated to a predetermined temperature. While the temperature is maintained, a material containing a metal is applied (or printed by a screen printing method) to the single crystal semiconductor layer 112 so that a metal layer 120 is formed (see FIG. 3C). The heating temperature is not particularly limited as long as it is the temperature at which the metal layer 120 can be formed. The metal layer 120 can be formed using a material such as aluminum or copper. Note that this embodiment employs the application method (or a screen printing method) to form the metal layer 120; however, an embodiment of the present invention disclosed is not limited thereto. Alternatively, a sputtering method or the like may be employed.

Figure 3D:
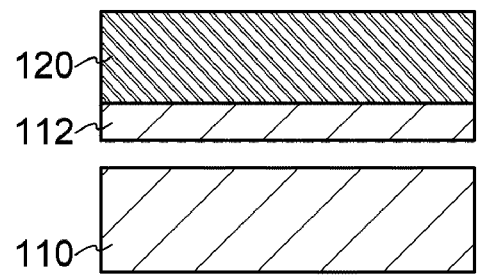

Subsequently, cooling is performed on the single crystal semiconductor substrate 110, the single crystal semiconductor layer 112, and the metal layer 120, whereby the single crystal semiconductor layer 112 is separated from the single crystal semiconductor substrate 110 at an interface between the single crystal semiconductor substrate 110 and the single crystal semiconductor layer 112. Accordingly, a stacked-layer structure formed of the metal layer 120 and the single crystal semiconductor layer 112 is formed (see FIG. 3D). Temperature of the cooling can be around room temperature for example, though not particularly limited. Needless to say, the temperature may be lower than room temperature.

In the above step, it is a great difference in a coefficient of thermal expansion between a single-crystal semiconductor material and a metal material that enables the separation of the single crystal semiconductor layer 112 from the single crystal semiconductor substrate 110. It can be inferred from this phenomenon that smooth separation is realized by a great difference between the deposition temperature of the metal layer 120 and the cooling temperature.

Figure 3E:

After that, the metal layer 120 is removed, so that the single crystal semiconductor layer 112 as a self-supported film can be obtained (see FIG. 3E). This embodiment employs a structure including the removing step of the metal layer 120 as the last step; however, an embodiment of the present invention disclosed is not limited thereto. For example, in the case of utilizing the metal layer 120 as an electrode or the like, a structure may be employed in which the metal layer 120 is left without being removed. In addition, the obtained single crystal semiconductor layer 112 may be used as is or used after being bonded to a certain substrate.

Although not shown in this embodiment, a dynamical method using a substrate separation apparatus or the like (a method in which the layer is simply taken off), a method such as water jetting by which separation is promoted, or the like may be used in combination with the above separation.

Although not shown in this embodiment, laser beam irradiation may be performed on the single crystal semiconductor layer 112 which is obtained through the above steps. As a result of this, the number of the defects in the single crystal semiconductor layer 112 can be reduced and the planarity of the surface thereof can be improved. Heat treatment may be performed on the single crystal semiconductor layer 112 in order to reduce the number of the defects.

Further, treatment for thinning the single crystal semiconductor layer 112 or treatment for further improving the planarity may be performed. As the treatment, one of dry etching or wet etching, or etching in which dry etching and wet etching are combined can be used.

According to an embodiment of the present invention disclosed, a single crystal semiconductor layer formed by a vapor-phase epitaxial growth method is separated from a single crystal semiconductor substrate by utilizing the stress of the single crystal semiconductor layer. Thus, a defect or the like does not occur in the single crystal semiconductor layer itself, which means that heat treatment at high temperature is not needed. In addition, the single crystal semiconductor layer after being separated has high planarity; therefore, planarization treatment such as CMP treatment is not needed. Accordingly, an embodiment of the present invention disclosed makes it possible to provide a large-sized single crystal semiconductor layer having favorable characteristics.

Further, according to an embodiment of the present invention disclosed, since the method is employed in which the single crystal semiconductor layer formed by the vapor-phase epitaxial growth method is separated at an interface with the single crystal semiconductor substrate, the thickness of the single crystal semiconductor substrate itself is not reduced and the single crystal semiconductor substrate can be repeatedly used.

The structure described in this embodiment can be implemented by being combined as appropriate with structures described in the other embodiments or an example in this specification.

Embodiment 4

This embodiment will describe another example of a method for manufacturing a single crystal semiconductor layer with reference to drawings. Note that the method for manufacturing a semiconductor substrate according to Embodiment 1 or Embodiment 2 is applied to the method for manufacturing a single crystal semiconductor layer according to this embodiment.

First, a single crystal semiconductor substrate 110 is prepared (see FIG. 4A). A detailed description of the single crystal semiconductor substrate 110 is omitted here because Embodiment 1 and the like can be referred to.

Next, a single crystal semiconductor layer 112 is formed on the single crystal semiconductor substrate 110 by a vapor-phase epitaxial growth method (see FIG. 4B). Embodiment 1 and the like can be referred to also for details of the method for manufacturing the single crystal semiconductor layer 112. Note that in this embodiment the single crystal semiconductor layer 112 is formed to have enough thickness, which is, in specific, greater than or equal to 5 μm (and less than or equal to 100 μm). By forming the single crystal semiconductor layer 112 to have such a thickness, the compressive stress thereof becomes high enough to enable the single crystal semiconductor layer 112 to be spontaneously separated from the single crystal semiconductor substrate 110 (see FIGS. 4C and 4D). In addition, by forming the single crystal semiconductor layer 112 to have enough thickness, the single crystal semiconductor layer 112 can be separated to be a self-supported film. The single crystal semiconductor layer 112 after being separated may be used as is or used after being bonded to a certain substrate.

Although not shown in this embodiment, a dynamical method using a substrate separation apparatus or the like (a method in which the layer is simply taken off), a method such as water jetting by which separation is promoted, or the like may be used in combination with the above separation.

Although not shown in this embodiment, laser beam irradiation may be performed on the single crystal semiconductor layer 112 which is obtained through the above steps. As a result of this, the number of the defects in the single crystal semiconductor layer 112 can be reduced and the planarity of the surface thereof can be improved. Heat treatment may be performed on the single crystal semiconductor layer 112 in order to reduce the number of the defects.

Further, treatment for thinning the single crystal semiconductor layer 112 or treatment for further improving the planarity may be performed. As the treatment, one of dry etching or wet etching, or etching in which dry etching and wet etching are combined can be used.

According to an embodiment of the present invention disclosed, a single crystal semiconductor layer formed by a vapor-phase epitaxial growth method is separated from a single crystal semiconductor substrate by utilizing the stress of the single crystal semiconductor layer. Thus, a defect or the like does not occur in the single crystal semiconductor layer itself, which means that heat treatment at high temperature is not needed. In addition, the single crystal semiconductor layer after being separated has high planarity; therefore, planarization treatment such as CMP treatment is not needed. Accordingly, an embodiment of the present invention disclosed makes it possible to provide a large-sized single crystal semiconductor layer having favorable characteristics.

Further, according to an embodiment of the present invention disclosed, since the method is employed in which the single crystal semiconductor layer formed by the vapor-phase epitaxial growth method is separated at an interface with the single crystal semiconductor substrate, the thickness of the single crystal semiconductor substrate itself is not reduced and the single crystal semiconductor substrate can be repeatedly used.

The structure described in this embodiment can be implemented by being combined as appropriate with structures described in the other embodiments or an example in this specification.

Embodiment 5

This embodiment will describe a method for manufacturing a semiconductor device with reference to FIGS. 5A to 5D, FIGS. 6A to 6D, and FIG. 7A, and FIG. 7B. Hereinafter, a method for manufacturing a semiconductor device having a plurality of transistors, which is an example of a semiconductor device, will be described. Note that various semiconductor devices can be manufactured with the use of transistors described below in combination.

Figure 5A:
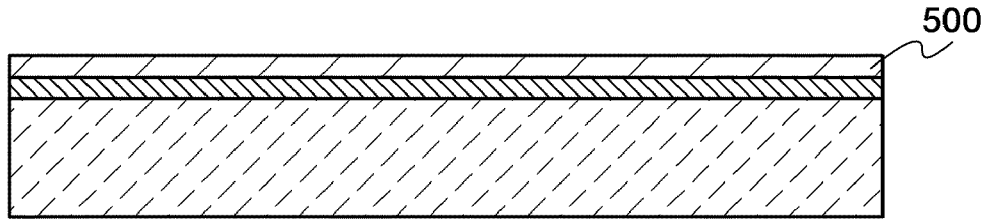
FIGS. 5A to 5D are cross-sectional views of an example of a method for manufacturing a transistor.
Figure 5B:
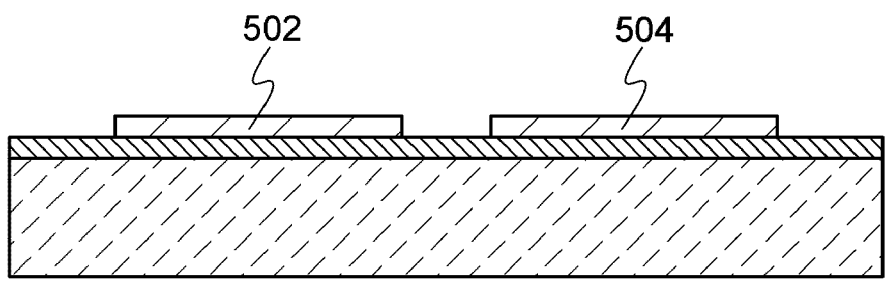

FIG. 5A is a cross-sectional view of a semiconductor substrate manufactured according to Embodiment 1.

To control threshold voltages of TFTs, an impurity element imparting p-type such as boron, aluminum, or gallium or an impurity element imparting n-type such as phosphorus or arsenic may be added to a semiconductor layer 500 (which corresponds to the single crystal semiconductor layer 112 in Embodiment 1). A region where the impurity element is added and the kind of the impurity element can be changed as appropriate. For example, an impurity element imparting p-type is added to a formation region of an n-channel TFT, and an impurity element imparting n-type is added to a formation region of a p-channel TFT. In adding the above-described impurity elements, the dosage may be about greater than or equal to $1 \times 10^{15}$ atoms/cm$^2$ and less than or equal to $1 \times 10^{17}$ atoms/cm$^2$. Then, the semiconductor layer 500 is separated into island shapes to form a semiconductor film 502 and a semiconductor film 504 (see FIG. 5B).

Figure 5C:
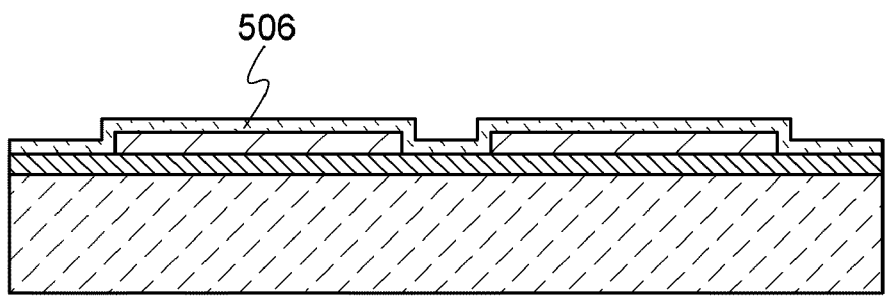

Next, a gate insulating film 506 is formed so as to cover the semiconductor films 502 and 504 (see FIG. 5C). Here, a single layer of a silicon oxide film is formed by a plasma CVD method. Alternatively, as the gate insulating film 506, a single layer or stacked layers using a film containing silicon oxynitride, silicon nitride oxide, silicon nitride, hafnium oxide, aluminum oxide, tantalum oxide, or the like may be formed.

As another manufacturing method other than the plasma CVD method, a sputtering method or a method for oxidizing or nitriding by high-density plasma treatment can be given. High-density plasma treatment is performed using, for example, a mixed gas of a rare gas such as helium, argon, krypton, or xenon and a gas such as oxygen, nitrogen oxide, ammonia, nitrogen, or hydrogen. In that case, by exciting plasma by introduction of microwaves, plasma with low electron temperature and high density can be generated. The surfaces of the semiconductor films are oxidized or nitrided by oxygen radicals (OH radicals may be included) or nitrogen radicals (NH radicals may be included) which are generated by such high-density plasma, whereby the insulating film with a thickness of greater than or equal to 1 nm and less than or equal to 20 nm, preferably, greater than or equal to 2 nm and less than or equal to 10 nm is formed so as to be in contact with the semiconductor films.

The above-described oxidation or nitridation of the semiconductor films by the high-density plasma treatment is a solid-phase reaction, and therefore, an interface state density between the gate insulating film 506 and each of the semiconductor films 502 and 504 can be extremely decreased. Further, the semiconductor films are directly oxidized or nitrided by the high-density plasma treatment, whereby variation in the thickness of the insulating film to be formed can be suppressed. Since the semiconductor films are single crystal films, even when the surfaces of the semiconductor films are oxidized by a solid-phase reaction by using the high-density plasma treatment, a gate insulating film with high uniformity and a low interface state density can be formed. The insulating film formed by the high-density plasma treatment is used for part of or the entire gate insulating film of a transistor, whereby variation in characteristics of the transistors can be suppressed.

Alternatively, the gate insulating film 506 may be formed by thermally oxidizing the semiconductor films 502 and 504. In the case of using the thermal oxidation, it is necessary to use a glass substrate having a certain degree of heat resistance.

Note that, a gate insulating film containing hydrogen may be formed as the gate insulating film 506, and then heat treatment at a temperature higher than or equal to 350° C. and lower than or equal to 450° C. may be performed to disperse the hydrogen contained in the gate insulating film 506 into the semiconductor films 502 and 504. In that case, a silicon nitride film or a silicon nitride oxide film formed by a plasma CVD method can be used as the gate insulating film 506. The process temperature may be set to lower than or equal to 350° C. In this manner, by supplying hydrogen to the semiconductor films 502 and 504, the number of the defects in the semiconductor films 502 and 504, at an interface between the gate insulating film 506 and the semiconductor film 502, and at an interface between the gate insulating film 506 and the semiconductor film 504 can be effectively reduced.

Figure 5D:
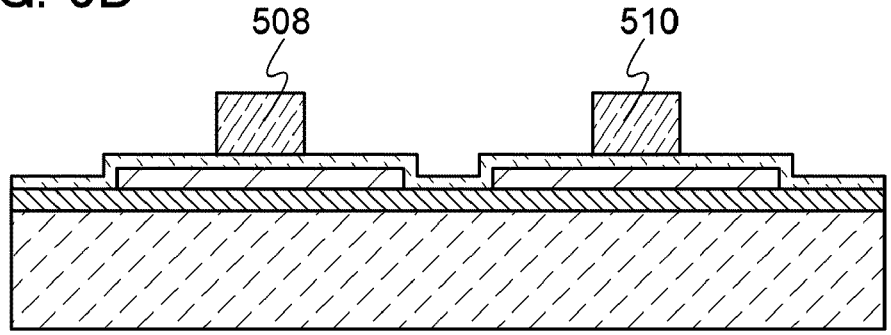

Next, a conductive film is formed on the gate insulating film 506, and then the conductive film is processed (patterned) into a predetermined shape, so that an electrode 508 and an electrode 510 are formed over the semiconductor film 502 and the semiconductor film 504 respectively (see FIG. 5D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal may be used. Further alternatively, a semiconductor material such as polycrystalline silicon, which is obtained by doping a semiconductor with an impurity element that imparts a conductivity type, or the like may be used.

Although a single-layer conductive film is used as each of the electrodes 508 and 510 in this embodiment, the structure of the electrodes is not limited thereto. Each of the electrodes 508 and 510 may be formed of a plurality of conductive films which is stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be employed.

Note that a mask used for forming the electrodes 508 and 510 may be formed using a material such as silicon oxide or silicon nitride oxide. In that case, a step of forming a mask by patterning a silicon oxide film, a silicon nitride oxide film, or the like is additionally needed; however, the amount of thickness reduction of the mask in etching is smaller than that of a resist material, so that the electrodes 508 and 510 with a more precise shape can be formed. Alternatively, the electrodes 508 and 510 may be selectively formed by a droplet discharge method without using a mask. Here, a droplet discharge method refers to a method in which droplets containing a predetermined composition are discharged or ejected to form a predetermined pattern, and includes an ink-jet method in its category.

Alternatively, the electrodes 508 and 510 can be formed in such a manner that an inductively coupled plasma (ICP) etching method is used, and etching conditions (for example, the amount of electric power applied to a coiled electrode, the amount of electric power applied to an electrode on the substrate side, the electrode temperature on the substrate side, or the like) are regulated as appropriate, so that the conductive film is etched so as to obtain a desired tapered shape. The tapered shape can be adjusted by the shape of the mask. Note that as an etching gas, a chlorine based gas such as chlorine, boron chloride, silicon chloride, or carbon tetrachloride; a fluorine based gas such as carbon tetrafluoride, sulfur fluoride, or nitrogen fluoride; oxygen; or the like can be used as appropriate.

Figure 6A:
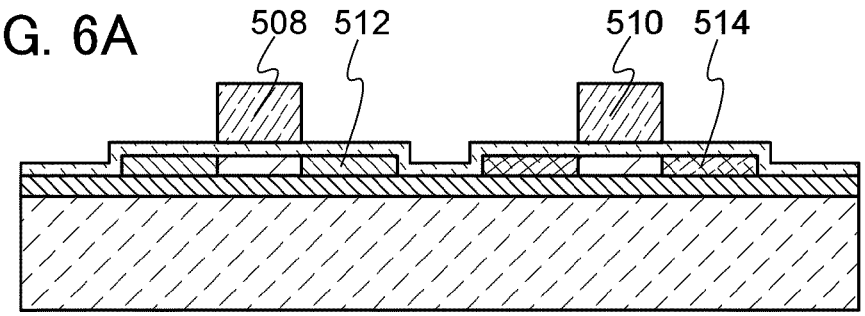
FIGS. 6A to 6D are cross-sectional views of an example of a method for manufacturing a transistor.

Next, an impurity element imparting one conductivity type is added to the semiconductor films 502 and 504 with the electrodes 508 and 510 used as masks (see FIG. 6A). In this embodiment, an impurity element imparting n-type conductivity (for example, phosphorus or arsenic) is added to the semiconductor film 502, and an impurity element imparting p-type conductivity (for example, boron) is added to the semiconductor film 504. Note that when the impurity element imparting n-type conductivity is added to the semiconductor film 502, the semiconductor film 504 to which the impurity element imparting p-type is added is covered with a mask or the like so that the impurity element imparting n-type conductivity is added selectively. Further, when the impurity element imparting p-type conductivity is added to the semiconductor film 504, the semiconductor film 502 to which the impurity elment imparting n-type is added is covered with a mask or the like so that the impurity element imparting p-type conductivity is added selectively. Alternatively, after an impurity element imparting one of p-type and n-type conductivities is added to the semiconductor films 502 and 504, an impurity element imparting the other conductivity may be added to only one of the semiconductor films at a higher concentration. By the addition of the impurity element, impurity regions 512 are formed in the semiconductor film 502 and impurity regions 514 are formed in the semiconductor film 504.

Figure 6B:
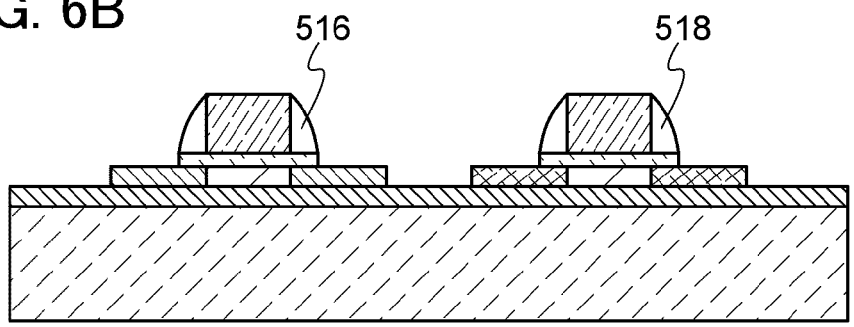

Subsequently, sidewalls 516 are formed on the side surfaces of the electrode 508 and sidewalls 518 are formed on the side surfaces of the electrode 510 (see FIG. 6B). The sidewalls 516 and 518 can be formed by, for example, newly forming an insulating film so as to cover the gate insulating film 506 and the electrodes 508 and 510 and then partially etching the insulating film by anisotropic etching mainly in a perpendicular direction. Note that the gate insulating film 506 may also be etched partially by the above-described anisotropic etching. As the insulating film for forming the sidewalls 516 and 518, a film including silicon, silicon oxide, silicon nitride, silicon oxynitride, silicon nitride oxide, an organic material, or the like may be formed to have a single-layer structure or a stacked-layer structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps for forming the sidewalls 516 and 518 are not limited to these steps.

Figure 6C:
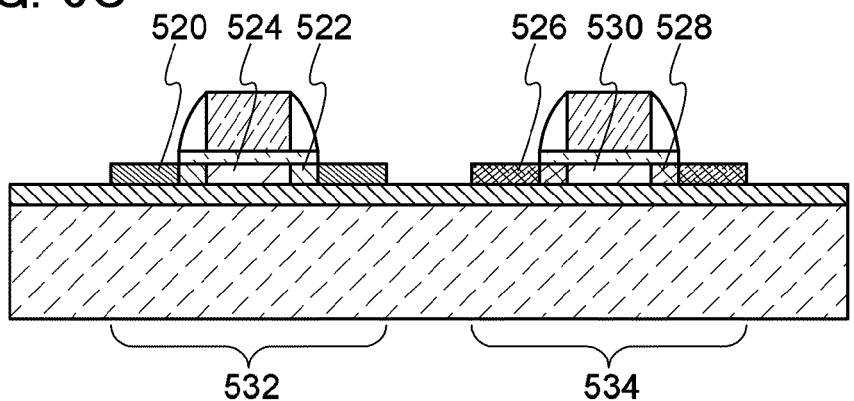

Next, an impurity element imparting one conductivity type is added to the semiconductor films 502 and 504 with the gate insulating film 506 and the electrodes 508 and 510 and the sidewalls 516 and 518 used as masks (see FIG. 6C). Note that the impurity element imparting the same conductivity type as the impurity element which has been added in the previous process is added to the semiconductor films 502 and 504 at a higher concentration than that in the previous process. Here, when the impurity element imparting n-type conductivity is added to the semiconductor film 502, the semiconductor film 504 to which the impurity element imparting p-type is added is covered with a mask or the like so that the impurity element imparting n-type conductivity is added selectively. Further, when the impurity element imparting p-type conductivity is added to the semiconductor film 504, the semiconductor film 502 to which the impurity element imparting n-type is added is covered with a mask or the like so that the impurity element imparting p-type conductivity is added selectively.

By the above-described addition of the impurity element, a pair of high-concentration impurity regions 520, a pair of low-concentration impurity regions 522, and a channel formation region 524 are formed in the semiconductor film 502. In addition, by the above-described addition of the impurity element, a pair of high-concentration impurity regions 526, a pair of low-concentration impurity regions 528, and a channel formation region 530 are formed in the semiconductor film 504. The high-concentration impurity regions 520 and the high-concentration impurity regions 526 each serve as a source or a drain, and the low-concentration impurity regions 522 and the low-concentration impurity regions 528 each serve as an LDD (lightly doped drain) region.

Note that the sidewalls 516 formed over the semiconductor film 502 and the sidewalls 518 formed over the semiconductor film 504 may be formed so as to have the same length in a direction where carriers move (a direction parallel to a so-called channel length), or may be formed so as to have different lengths. It is preferable that the sidewalls 518 over the semiconductor film 504 which is included in a p-channel transistor be larger than the sidewalls 516 over the semiconductor film 502 which is included in an n-channel transistor. This is because boron which is added for forming a source and a drain in the p-channel transistor is easily diffused and a short channel effect is easily induced. In the p-channel transistor, by making the length of the sidewalls 518 greater than that of the sidewalls 516, boron can be added to the source and the drain at a high concentration, and thus the resistance of the source and the drain can be reduced.

A silicide layer in which silicide is formed in part of the semiconductor films 502 and 504 may be formed in order to further reduce the resistance of the source and the drain. The silicide is formed by placing a metal in contact with the semiconductor films and causing a reaction between the metal and silicon in the semiconductor films by heat treatment (for example, a GRTA method, an LRTA method, or the like). The silicide layer may be formed from cobalt silicide or nickel silicide. In the case where the semiconductor films 502 and 504 are thin, a silicide reaction may be made to proceed to the bottoms of the semiconductor films 502 and 504. As a metal material used for the silicification, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can be formed by laser beam irradiation or the like.

Through the aforementioned steps, an n-channel transistor 532 and a p-channel transistor 534 are formed. Note that although conductive films serving as source electrodes or drain electrodes are not formed in the stage shown in FIG. 6C, a structure including these conductive films serving as source electrodes and drain electrodes may be referred to as a transistor.

Figure 6D:
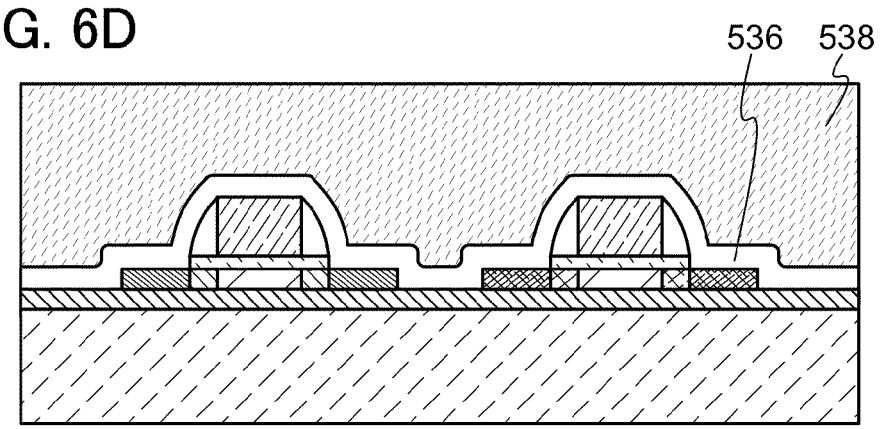

Next, an insulating film 536 is formed so as to cover the n-channel transistor 532 and the p-channel transistor 534 (see FIG. 6D). The insulating film 536 is not always necessary; however, the formation of the insulating film 536 can prevent impurities such as an alkali metal or an alkaline-earth metal from entering the n-channel transistor 532 and the p-channel transistor 534. In specific, the insulating film 536 is desirably formed from a material such as silicon oxide, silicon nitride, silicon oxynitride, silicon nitride oxide, aluminum nitride, aluminum oxide, or the like. In this embodiment, a silicon nitride oxide film with a thickness of about 600 nm is used as the insulating film 536. Note that although the insulating film 536 is formed to have a single-layer structure in this embodiment, it is needless to say that the insulating film 536 may have a stacked-layer structure. For example, in the case of a two-layer structure, the insulating film 536 may have a stacked-layer structure of a silicon oxynitride film and a silicon nitride oxide film.

Next, an insulating film 538 is formed on the insulating film 536 so as to cover the n-channel transistor 532 and the p-channel transistor 534. The insulating film 538 may be formed from an organic material having heat resistance, such as polyimide, acrylic, benzocyclobutene, polyamide, or epoxy. As an alternative to the organic materials listed above, a low-dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like can be used. Here, the siloxane-based resin corresponds to a resin including a Si—O—Si bond which is formed using a siloxane-based material as a starting material. The siloxane-based resin may include any one of hydrogen, fluorine, an alkyl group, and aromatic hydrocarbon as a substituent. Note that the insulating film 538 may be formed by stacking a plurality of insulating films formed from any of these materials.

For the formation of the insulating film 538, the following method can be used depending on the material of the insulating film 538: a CVD method, a sputtering method, an SOG method, a spin coating method, a dip coating method, a spray coating method, a droplet discharge method (such as an inkjet method, a screen printing, or an offset printing), a doctor knife, a roll coater, a curtain coater, a knife coater, or the like.

Next, contact holes are formed in the insulating film 536 and the insulating film 538 so as to partially expose the semiconductor films 502 and 504. Then, conductive films 540 and 542 which are in contact with the semiconductor film 502 through the contact holes and conductive films 544 and 546 which are in contact with the semiconductor film 504 through the contact holes are formed (see FIG. 7A). The conductive films 540, 542, 544, and 546 serve as source and drain electrodes of the transistors. Note that in this embodiment, as an etching gas for forming the contact holes, a mixed gas of $CHF_3$ and He can be used; however, the type of the etching gas is not limited thereto.

The conductive films 540, 542, 544, and 546 can be formed by a CVD method, a sputtering method, or the like. In specific, the conductive films 540, 542, 544, and 546 can be formed from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as a main component or a compound containing the above-described material may be used. Further, the conductive films 540, 542, 544, and 546 may each have a single-layer structure or a stacked-layer structure.

As an example of an alloy containing aluminum as a main component, an alloy containing aluminum as its main component and also containing nickel can be given. In addition, an alloy containing aluminum as its main component and also containing nickel and one or both of carbon and silicon can also be given as an example thereof. Aluminum and aluminum silicon (Al—Si), which have low resistance and are inexpensive, are suitable as a material for forming the conductive films 540, 542, 544, and 546. In particular, aluminum silicon is preferable because a hillock can be prevented from being generated in resist baking at the time of patterning. Further, a material in which Cu is mixed into aluminum at about 0.5% may be used instead of silicon.

In the case where each of the conductive films 540, 542, 544, and 546 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming conductive films so as to interpose an aluminum silicon film between the barrier films, generation of a hillock of aluminum or aluminum silicon can be further prevented. Further, in the case of forming the barrier film by using titanium that is a highly reducible element, a thin oxide film which would be formed on the semiconductor films 502 and 504 is reduced by the titanium contained in the barrier film, so that contact between the conductive films 540 and 542 and the semiconductor film 502 and contact between the conductive films 544 and 546 and the semiconductor film 504 can be favorable. Further, it is also possible to stack a plurality of barrier films. In that case, for example, each of the conductive films 540, 542, 544, and 546 can be formed to have a five-layer structure including, for example, titanium, titanium nitride, aluminum silicon, titanium, and titanium nitride in this order from the lower layer; or a stacked-layer structure including more than five layers.

As the conductive films 540, 542, 544, and 546, tungsten silicide formed by a chemical vapor deposition method using a $WF_6$ gas and a $SiH_4$ gas may be used. Alternatively, tungsten formed by hydrogen reduction of $WF_6$ may be used for forming the conductive films 540, 542, 544, and 546.

The conductive films 540 and 542 are connected to the high-concentration impurity regions 520 in the n-channel transistor 532. The conductive films 544 and 546 are connected to the high-concentration impurity regions 526 in the p-channel transistor 534.

Figure 7A:
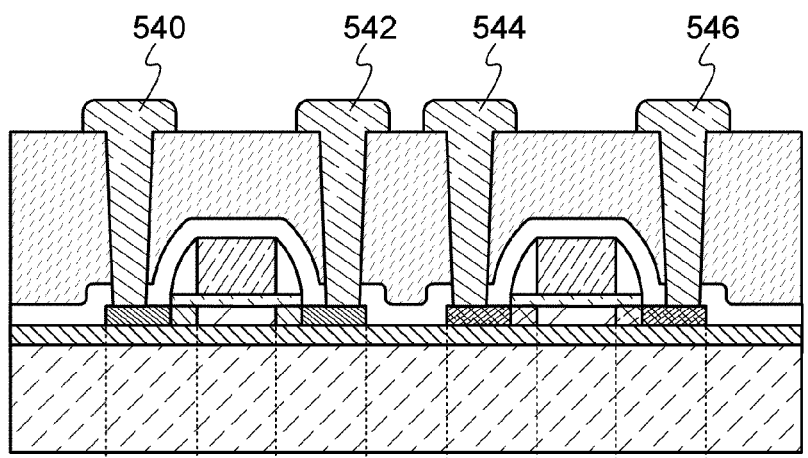
FIG. 7A is a cross-sectional view of a transistor and FIG. 7B is a plan view of the transistor.
Figure 7B:
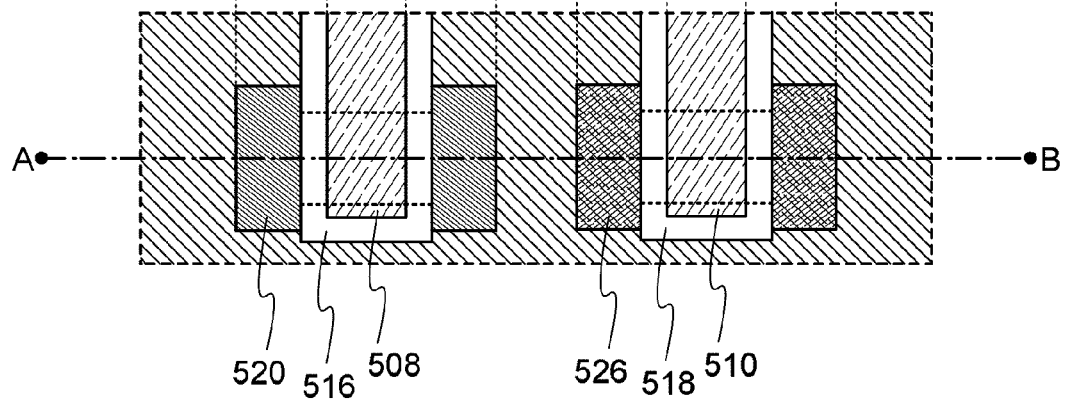

FIG. 7B is a plan view of the n-channel transistor 532 and the p-channel transistor 534 which are illustrated in FIG. 7A. Here, a cross section taken along line A-B in FIG. 7B corresponds to FIG. 7A. For simplicity, the conductive films 540, 542, 544, and 546 and the insulating films 536 and 538 and the like are omitted in FIG. 7B.

Note that although the case where each of the n-channel transistor 532 and the p-channel transistor 534 includes one electrode serving as a gate electrode (the electrode 508 and the electrode 510) is described in this embodiment, the structure of the transistors is not limited thereto. The transistor manufactured according to one embodiment of the present invention may have a multi-gate structure in which a plurality of electrodes serving as gate electrodes are included and electrically connected to one another.

In this embodiment, transistors are formed using a single crystal semiconductor layer. Accordingly, switching speed of the transistors is increased as compared to the case where an amorphous semiconductor layer, a non-single-crystal semiconductor layer, or the like is used. Further, in this embodiment, a uniform and favorable single crystal semiconductor layer is used, so that variation in characteristics between the transistors can be suppressed enough. In this manner, a semiconductor device with excellent characteristics can be provided.

This embodiment can be implemented by being combined as appropriate with the other embodiments or an example.

Embodiment 6

This embodiment will describe a method for manufacturing a photoelectric conversion device (such as a solar cell) with reference to FIGS. 8A to 8E. Hereinafter, the case of manufacturing a photoelectric conversion device by using a modification of the single crystal semiconductor layer manufactured by the method according to Embodiment 1 will be described.

First, in accordance with the example described in Embodiment 1, a structure is formed in which an insulating layer 802, a first conductive layer 804, a first impurity semiconductor layer 806 having one conductivity type, and a semiconductor layer 808 to which an impurity element is not (intentionally) added are stacked in this order over a base substrate 800 (see FIG. 8A). Here, the first impurity semiconductor layer 806 and the semiconductor layer 808 are parts of the single crystal semiconductor layer 112 in Embodiment 1. In other words, the above structure is formed as follows: an impurity element having one conductivity type is added to the single crystal semiconductor layer 112; then, the first conductive layer 804 is formed on the single crystal semiconductor layer 112; lastly, the insulating layer 114 is formed over the conductive layer 804, before the insulating layer 114 is formed over the single crystal semiconductor layer 112 in accordance with Embodiment 1.

The "one conductivity type" described above may be either n-type or p-type. In this embodiment, the case where the conductivity type is n-type will be described. In this case, an n-type impurity element such as phosphorus or arsenic may be added. In the case of p-type, boron or the like may be added.

The first conductive layer 804 can be formed from a material such as tantalum (Ta), tungsten (W), titanium (Ti), molybdenum (Mo), aluminum (Al), gold (Au), silver (Ag), copper (Cu), chromium (Cr), or niobium (Nb). Alternatively, an alloy material containing the above-described metal as a main component or a compound containing the above-described metal may be used. Note that, although the first conductive layer 804 is formed to have a single-layer structure in this embodiment, a stacked-layer structure may be employed. In the case of employing a stacked-layer structure, for example, a conductive layer can be used in which a layer formed from a material having low resistance such as aluminum is interposed between layers formed from a material having a high barrier property such as titanium nitride or tantalum nitride.

Next, a second impurity semiconductor layer 810, to which a conductivity type opposite to that of the first impurity semiconductor layer 806 is imparted, is formed over the semiconductor layer 808 (see FIG. 8B). In this embodiment, boron is added as the impurity element, whereby the second impurity semiconductor layer 810 having p-type conductivity is formed. The second impurity semiconductor layer 810 can be formed by a CVD method or the like.

Note that the thickness of the second impurity semiconductor layer 810 is preferably around greater than or equal to 20 nm and less than or equal to 200 nm, more preferably around greater than or equal to 50 nm and less than or equal to 100 nm. By forming the second impurity semiconductor layer 810 thinly, recombination of carriers in the second impurity semiconductor layer 810 can be prevented.

Then, a second conductive layer 812 is formed over the second impurity semiconductor layer 810 by using a light-transmitting conductive material, which particularly transmits light having a wavelength which is absorbed by the semiconductor layer 808 (see FIG. 8C). Although the second conductive layer 812 is not necessarily required, it is preferable to provide the second conductive layer 812 for improvement of the photoelectric conversion efficiency.

After that, the first impurity semiconductor layer 806, the semiconductor layer 808, the second impurity semiconductor layer 810 and the second conductive layer 812 which are provided over the first conductive layer 804 are etched so as to partially expose the first conductive layer 804 (preferably, end portions of the first conductive layer 804) (see FIG. 8D).

Here, the purpose of partially exposing the first conductive layer 804 is to form an electrode or a wiring (an auxiliary electrode or an auxiliary wiring) which is connected to the first conductive layer 804. In order that the photoelectric conversion device may function, it is required that electric energy be extracted from conductive layers (electrodes) corresponding to a positive electrode and a negative electrode. However, since an upper portion of the first conductive layer 804 is covered with the semiconductor layer and the like and the base substrate 800 is provided below the first conductive layer 804, electric energy is difficult to be extracted from this structure as it is. To solve such a problem, a part of the layers formed over the first conductive layer 804 is removed to expose a part of the first conductive layer 804 and to form an electrode or a wiring (an auxiliary electrode or an auxiliary wiring) which can be led.

In specific, the etching may be performed using a resist material or an insulating material such as silicon nitride over the second conductive layer 812 as a mask. For example, the etching may be performed by dry etching using a fluorine based gas such as $NF_3$ or $SF_6$ under a condition under which at least an etching selectivity ratio of the layers (the first impurity semiconductor layer 806, the semiconductor layer 808, the second impurity semiconductor layer 810, and the second conductive layer 812) formed over the first conductive layer 804 to the first conductive layer 804 is sufficiently high. Note that after the etching, the mask is removed.

Next, an auxiliary electrode 814 to be connected to the exposed part of the first conductive layer 804 and an electrode 816 to be connected to the second conductive layer 812 are formed (see FIG. 8E).

The auxiliary electrode 814 is provided to facilitate extraction of electric energy converted from light. That is, the auxiliary electrode 814 functions as an extracting electrode (also referred to as a collecting electrode).

The electrode 816 is formed to have a grid shape (or a pectinate shape or a comb-like shape) when seen in a plan view. Thus, the semiconductor layer 808 and the like can be irradiated with enough light and the light absorption efficiency can be increased. The shape of the electrode 816 is not limited to the above shape. Note that the electrode 816 is formed in the same steps as the auxiliary electrode 814.

The electrode 816 and the auxiliary electrode 814 may be each formed by a printing method or the like using aluminum, silver, lead-tin (solder), or the like. For example, the electrode 816 and the auxiliary electrode 814 can be formed using a silver paste by a screen printing method.

Thus, the photoelectric conversion device can be manufactured. Note that although this embodiment describes the case where the semiconductor layer utilized for photoelectric conversion is formed to have a single-layer structure (that is, the case of a so-called single cell), the structure of the photoelectric conversion device is not limited thereto. Instead, a so-called tandem cell may be employed in which the semiconductor layer utilized for photoelectric conversion is formed to have two layers.

In this embodiment, a uniform and favorable single crystal semiconductor layer is used for manufacturing a photoelectric conversion device; therefore, a photoelectric conversion device with a high photoelectric conversion efficiency can be manufactured. This embodiment can be implemented by being combined as appropriate with the other embodiments or an example.

Embodiment 7

In this embodiment, a method for manufacturing a photoelectric conversion device (such as solar cells) will be described with reference to FIGS. 9A to 9F. Described hereinafter is the case where a photoelectric conversion device is manufactured using a single crystal semiconductor layer manufactured by the method described in Embodiment 3 or 4.

First, a single crystal semiconductor layer 900 is prepared according to the method described in Embodiment 3 or 4 (see FIG. 9A).

Next, an impurity element having one conductivity type is dispersed into the single crystal semiconductor layer 900 by a gaseous diffusion method or the like, so that a first impurity region 902 is formed (see FIG. 9B). The above-described "one conductivity type" may be either n-type or p-type, and the case where the one conductivity type is n-type will be described in this embodiment. In the case where the conductivity type is n-type, phosphorus, arsenic, or the like may be dispersed as the impurity element. For example, $POCl_3$ is used as a diffusion source to diffuse phosphorus. On the other hand, in the case where the conductivity type is p-type, boron or the like may be dispersed.

Before the diffusion of the impurity element, roughness (texture) may be provided on the surface of the single crystal semiconductor layer 900. As a method for providing roughness on the surface, etching treatment or the like can be employed. Such surface roughness can improve the photoelectric conversion efficiency by a light-trapping effect into a semiconductor layer.

Next, an anti-reflection film 904 is formed on one surface of the first impurity region 902 (see FIG. 9C). Titanium oxide or the like may be used for forming the anti-reflection film 904. As a manufacturing method thereof, a CVD method or the like can be used.

After that, the first impurity region 902 in the region other than the region on a light-receiving surface side (the side where the anti-reflection film 904 is formed) is removed (see FIG. 9D). As a removing method thereof, etching treatment or the like may be used.

Next, a rear electrode 906 is formed on the opposite side to the light-receiving surface side (see FIG. 9E). The rear electrode 906 can be formed using the following material: tantalum (Ta), tungsten (W), titanium (Ti), molybdenum (Mo), aluminum (Al), gold (Au), silver (Ag), copper (Cu), chromium (Cr), niobium (Nb), or the like. In this embodiment, an aluminum film is formed as the rear electrode 906. As a manufacturing method thereof, there are a screen printing method, a sputtering method, and the like, and the screen printing method is used in this embodiment.

Note that in the case where the aluminum film is formed by a screen printing method, BSF (Back Surface Field) effect can be provided by diffusing aluminum into the single crystal semiconductor layer 900 to form a second impurity region 908 at the moment of a drying or baking process (see FIG. 9F).

Then, the anti-reflection film 904 is partially removed and a light-receiving surface electrode 910 is formed. The light-receiving surface electrode 910 may be formed using the same material as that of the rear electrode 906. However, the light-receiving surface electrode 910 is formed by a screen printing method using a silver paste in this embodiment.

Thus, the photoelectric conversion device can be manufactured. Note that although the case of manufacturing the photoelectric conversion device in which a semiconductor layer for photoelectric conversion is a single layer (a so-called single cell) is described in this embodiment, the structure of the photoelectric conversion device is not limited thereto. A so-called tandem cell in which the semiconductor layer for photoelectric conversion is two layers may be manufactured.

In this embodiment, a uniform and favorable single crystal semiconductor layer is used for manufacturing a photoelectric conversion device; therefore, a photoelectric conversion device with a high photoelectric conversion efficiency can be manufactured. This embodiment can be implemented by being combined as appropriate with the other embodiments or an example.

Embodiment 8

In this embodiment, an electronic device using the semiconductor device manufactured according to the above-described embodiment, particularly using a display device will be described with reference to FIGS. 10A to 10H and FIGS. 11A to 11C.

As electronic devices manufactured using a semiconductor device (particularly a display device), the following can be given: cameras such as a video camera and a digital camera, goggle-type displays (head-mounted displays), navigation systems, audio reproducing devices (such as car audio components), computers, game machines, portable information terminals (such as a mobile computer, a mobile phone, a portable game machine, and an e-book reader), and image reproducing devices provided with a recording medium (specifically, a device provided with a display device that can reproduce a recording medium such as a digital versatile disc (DVD) and display the image), and the like.

Figure 10A:
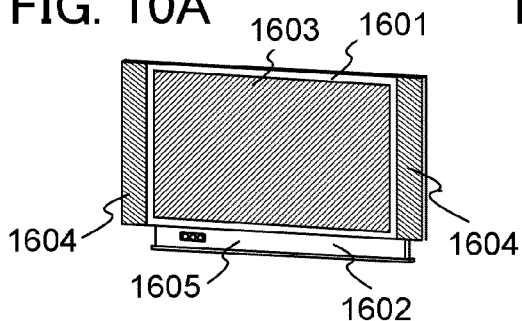
FIGS. 10A to 10H illustrate electronic devices using a semiconductor device.

FIG. 10A illustrates a television set or a monitor of a personal computer. The television set or the monitor of a personal computer includes a housing 1601, a support stand 1602, a display portion 1603, speaker portions 1604, a video input terminal 1605, and the like. The semiconductor device according to an embodiment of the present invention disclosed is used in the display portion 1603. According to an embodiment of the present invention disclosed, a television set or a monitor of a personal computer with high reliability and high performance can be provided at low cost.

Figure 10B:
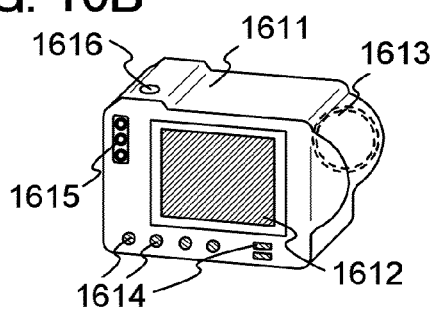

FIG. 10B illustrates a digital camera. An image receiving portion 1613 is provided in the front side of a main body 1611, and a shutter button 1616 is provided at the upper portion of the main body 1611. A display portion 1612, operation keys 1614, and an external connection port 1615 are provided at the backside of the main body 1611. The semiconductor device according to an embodiment of the present invention disclosed is used in the display portion 1612. According to an embodiment of the present invention disclosed, a digital camera with high reliability and high performance can be provided at low cost.

Figure 10C:
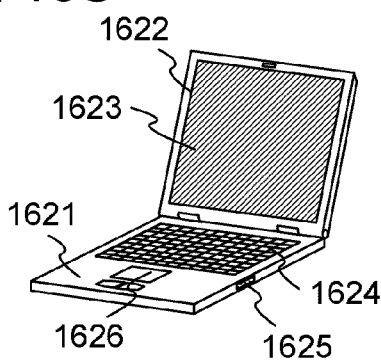

FIG. 10C illustrates a laptop personal computer. A main body 1621 is provided with a keyboard 1624, an external connection port 1625, and a pointing device 1626. A housing 1622 including a display portion 1623 is attached to the main body 1621. The semiconductor device according to an embodiment of the present invention disclosed is used in the display portion 1623. According to an embodiment of the present invention disclosed, a laptop personal computer with high reliability and high performance can be provided at low cost.

Figure 10D:
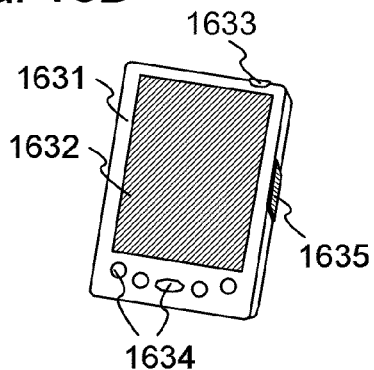

FIG. 10D illustrates a mobile computer, which includes a main body 1631, a display portion 1632, a switch 1633, operation keys 1634, an infrared port 1635, and the like. An active matrix display device is provided in the display portion 1632. The semiconductor device according to an embodiment of the present invention disclosed is used in the display portion 1632. According to an embodiment of the present invention disclosed, a mobile computer with high reliability and high performance can be provided at low cost.

Figure 10E:
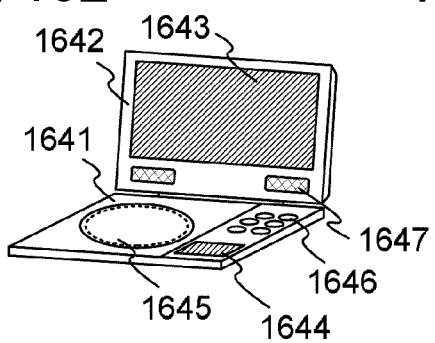

FIG. 10E illustrates an image reproducing device. A main body 1641 is provided with a display portion 1644, a recording medium reading portion 1645, and operation keys 1646. Further, a housing 1642 that has speaker portions 1647 and a display portion 1643 is attached to the main body 1641. The semiconductor device according to an embodiment of the present invention disclosed is used in each of the display portions 1643 and 1644. According to an embodiment of the present invention disclosed, an image reproducing device with high reliability and high performance can be provided at low cost.

Figure 10F:
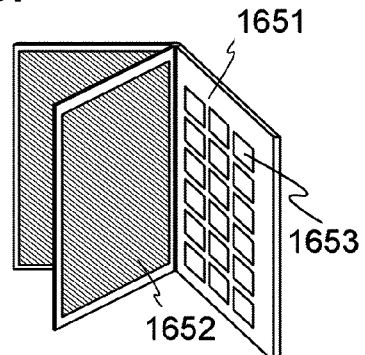

FIG. 10F illustrates an electronic book. A main body 1651 is provided with operation keys 1653. A plurality of display portions 1652 is attached to the main body 1651. The semiconductor device according to an embodiment of the present invention disclosed is used in the display portion 1652. According to an embodiment of the present invention disclosed, an electronic book with high reliability and high performance can be provided at low cost.

Figure 10G:
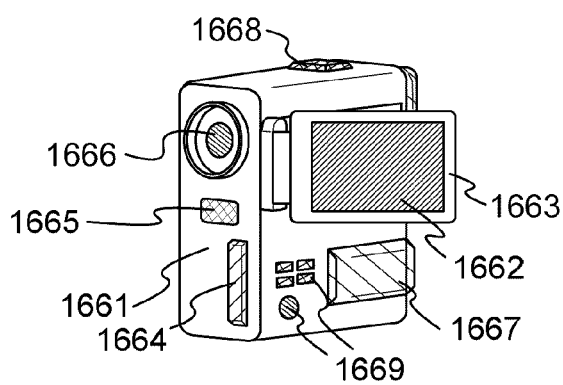

FIG. 10G illustrates a video camera. A main body 1661 is provided with an external connection port 1664, a remote control receiving portion 1665, an image receiving portion 1666, a battery 1667, an audio input portion 1668, and operation keys 1669. A housing 1663 including a display portion 1662 is attached to the main body 1661. The semiconductor device according to an embodiment of the present invention disclosed is used in the display portion 1662. According to an embodiment of the present invention disclosed, a video camera with high reliability and high performance can be provided at low cost.

Figure 10H:
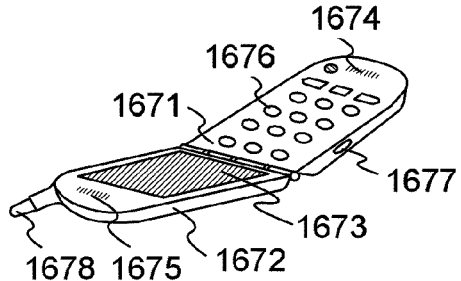

FIG. 10H illustrates a mobile phone, which includes a main body 1671, a housing 1672, a display portion 1673, an audio input portion 1674, an audio output portion 1675, operation keys 1676, an external connection port 1677, an antenna 1678, and the like. The semiconductor device according to an embodiment of the present invention disclosed is used in the display portion 1673. According to an embodiment of the present invention disclosed, a mobile phone with high reliability and high performance can be provided at low cost.

Figure 11A:
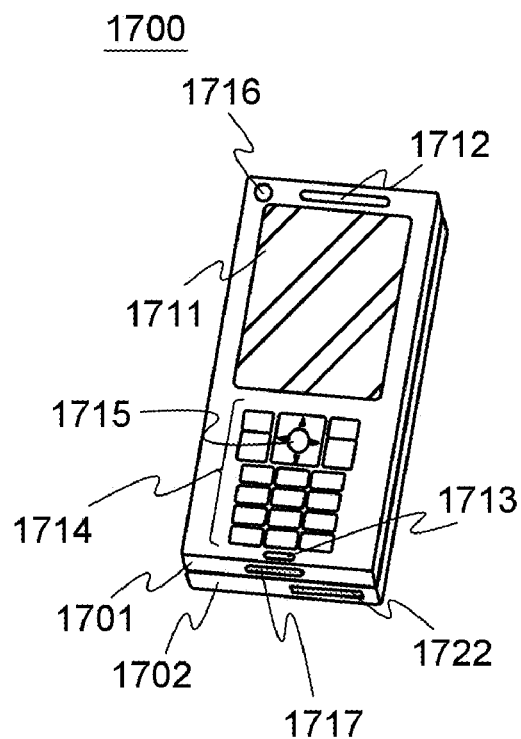
FIGS. 11A to 11C illustrate electronic devices using a semiconductor device.
Figure 11B:
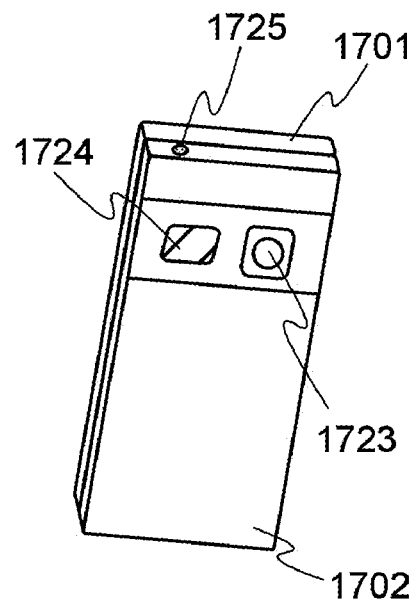
Figure 11C:
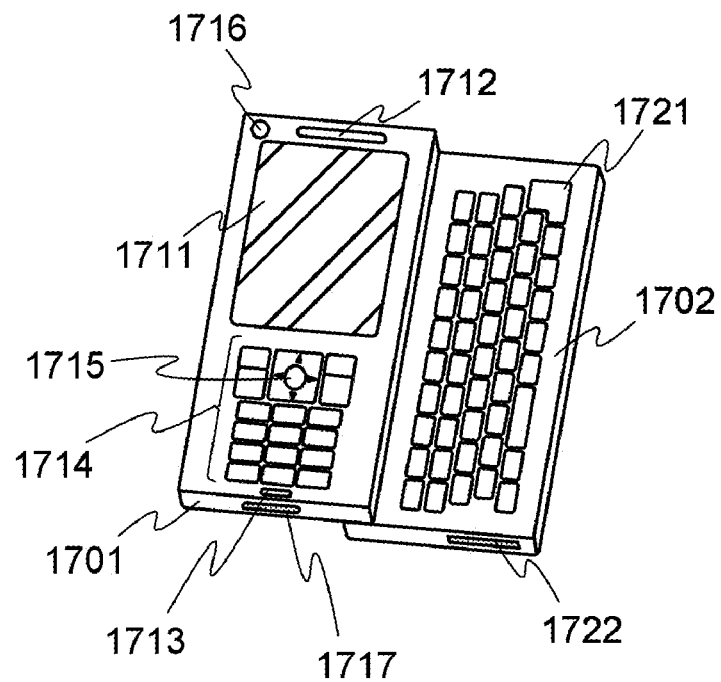

FIGS. 11A to 11C illustrate a structural example of a portable electronic device 1700 having functions as a telephone and an information terminal. FIG. 11A is a front view, FIG. 11B is a back view, and FIG. 11C is a developed view. The portable electronic device 1700 has functions as both a telephone and an information terminal and is an electronic device so-called a smartphone which is capable of various data processing in addition to voice call.

The portable electronic device 1700 includes housings 1701 and 1702. The housing 1701 is provided with a display portion 1711, a speaker 1712, a microphone 1713, operation keys 1714, a pointing device 1715, a camera lens 1716, an external connection terminal 1717, and the like. The housing 1702 is provided with a keyboard 1721, an external memory slot 1722, a camera lens 1723, a light 1724, an earphone terminal 1725, and the like. In addition, an antenna is incorporated in the housing 1701. In addition to the above-described structure, a wireless IC chip, a small size memory device, or the like can be incorporated therein.

The display portion 1711 includes the semiconductor device according to an embodiment of the present invention disclosed. An image displayed (and the direction in which the image is displayed) in the display portion 1711 variously changes depending on the usage mode of the portable electronic device 1700. Moreover, since the display portion 1711 and the camera lens 1716 are provided on the same plane, voice call with images (so-called video calling) is possible. Note that the speaker 1712 and the microphone 1713 can be used not only for voice call but also for recording, reproducing, or the like. In the case where a still image and a moving image are shot by using the camera lens 1723 (and the light 1724), the display portion 1711 is used as a finder. The operation keys 1714 are used for operation of incoming and outgoing calls, simple information input for electronic mail or the like, scrolling of a screen, cursor motion displayed in the display portion 1711, and the like.

The housings 1701 and 1702 overlapping with each other (FIG. 11A) can slide and can be developed as illustrated in FIG. 11C, so that the portable electronic device 1700 can be used as an information terminal. In that case, smooth operation with the keyboard 1721 and the pointing device 1715 can be performed. The external connection terminal 1717 can be connected to an AC adopter or various cables such as a USB cable, whereby the portable electronic device 1700 can be charged or can perform data communication with a computer or the like. Moreover, by inserting a recording medium into the external memory slot 1722, the portable electronic device 1700 can deal with storing and moving a large amount of data. In addition to the above-described functions, a function of wireless communication by using electromagnetic waves such as infrared rays, a television receiver function, and the like can be included. According to an embodiment of the present invention disclosed, a portable electronic device with high reliability and high performance can be provided at low cost.

As described above, the application range of the present invention disclosed is extremely wide and can be used for electronic devices in various fields. This embodiment can be implemented by being combined as appropriate with the other embodiments or an example.

Example 1

This example observed a state of separation of a single crystal semiconductor layer formed by a vapor-phase epitaxial growth method from a single crystal semiconductor substrate at an interface therebetween. Note that, in this example, a sample was formed in which a single crystal silicon substrate is used as the single crystal semiconductor substrate. A single crystal silicon layer was formed as the single crystal semiconductor layer by a plasma CVD method under the following condition: the flow rate (sccm) of silane and hydrogen, $SiH_4:H_2$ is 25 (sccm):150 (sccm); the temperature of the substrate 280° C.; the output electric power of the high-frequency power source 30 W; and the electric power frequency 27 MHz.

A glass substrate as a base substrate was bonded to the surface of the single crystal silicon layer of the above sample. Here, for simplification, the glass substrate and the single crystal silicon layer were bonded to each other using an abrasive material.

After the bonding, the single crystal silicon substrate and the glass substrate were separated from each other. Accordingly, the single crystal silicon layer was left on the glass substrate side. Further, the surface of the single crystal silicon substrate and the surface of the single crystal silicon layer had enough planarity.

Through the above steps, the state of the favorable separation of the single crystal silicon layer from the single crystal silicon substrate at the interface therebetween was observed.

Note that in the case where an adhesive tape is attached to the surface of the single crystal silicon layer of the above sample and then the adhesive tape is separated from the single crystal silicon substrate, a state of a favorable separation of the single crystal silicon layer from the single crystal silicon substrate at the interface therebetween was observed similarly to the above.

The structure described in this example can be implemented by being combined as appropriate with the other embodiments.

This application is based on Japanese Patent Application serial No. 2008-250114 filed with the Japan Patent Office on Sep. 29, 2008, the entire contents of which are hereby incorporated by reference.

What is claimed is:

1. A method for manufacturing an SOI substrate, comprising:
    forming a first single crystal semiconductor layer by a vapor-phase epitaxial growth method on a surface of a second single crystal semiconductor layer;
    bonding the first single crystal semiconductor layer and a base substrate to each other with an insulating layer interposed therebetween; and
    separating the first single crystal semiconductor layer and the second single crystal semiconductor layer from each other at an interface therebetween so as to provide the first single crystal semiconductor layer over the base substrate with the insulating layer interposed therebetween.

2. The method for manufacturing an SOI substrate according to claim 1,
    wherein the first single crystal semiconductor layer is a single crystal silicon layer.

3. The method for manufacturing an SOI substrate according to claim 2,
    wherein the single crystal silicon layer is formed by the vapor-phase epitaxial growth method using a mixed gas of a silane based gas and hydrogen as a source gas, and
    wherein a flow rate of the hydrogen in the source gas is greater than or equal to 4 times and less than or equal to 10 times that of the silane based gas.

4. The method for manufacturing an SOI substrate according to claim 1,
    wherein the second single crystal semiconductor layer is a single crystal silicon layer.

5. The method for manufacturing an SOI substrate according to claim 1,
    wherein the base substrate is a glass substrate.

6. A method for manufacturing an SOI substrate, comprising:
    forming a single crystal semiconductor layer by a vapor-phase epitaxial growth method on a surface of a single crystal semiconductor substrate;

bonding the single crystal semiconductor layer and a base substrate to each other with an insulating layer interposed therebetween; and separating the single crystal semiconductor substrate and the single crystal semiconductor layer from each other at an interface therebetween so as to provide the single crystal semiconductor layer over the base substrate with the insulating layer interposed therebetween.

7. The method for manufacturing an SOI substrate according to claim 6,
wherein the single crystal semiconductor layer is a single crystal silicon layer.

8. The method for manufacturing an SOI substrate according to claim 7,
wherein the single crystal silicon layer is formed by the vapor-phase epitaxial growth method using a mixed gas of a silane based gas and hydrogen as a source gas, and
wherein a flow rate of the hydrogen in the source gas is greater than or equal to 4 times and less than or equal to 10 times that of the silane based gas.

9. The method for manufacturing an SOI substrate according to claim 6,
wherein the single crystal semiconductor substrate is a single crystal silicon substrate.

10. The method for manufacturing an SOI substrate according to claim 6,
wherein the base substrate is a glass substrate.

11. A method for manufacturing a single crystal semiconductor layer, comprising:
forming a single crystal semiconductor layer by a vapor-phase epitaxial growth method on a surface of a single crystal semiconductor substrate;
forming a metal layer over the single crystal semiconductor layer while maintaining the single crystal semiconductor layer and the single crystal semiconductor substrate at a predetermined temperature;
separating the single crystal semiconductor layer and the metal layer from the single crystal semiconductor substrate at an interface between the single crystal semiconductor layer and the single crystal semiconductor substrate by cooling the single crystal semiconductor substrate, the single crystal semiconductor layer, and the metal layer; and
removing the metal layer from the single crystal semiconductor layer.

12. The method for manufacturing a single crystal semiconductor layer according to claim 11,
wherein the single crystal semiconductor layer is a single crystal silicon layer.

13. The method for manufacturing a single crystal semiconductor layer according to claim 12,
wherein the single crystal silicon layer is formed by the vapor-phase epitaxial growth method using a mixed gas of a silane based gas and hydrogen as a source gas, and
wherein a flow rate of the hydrogen in the source gas is greater than or equal to 4 times and less than or equal to 10 times that of the silane based gas.

14. The method for manufacturing a single crystal semiconductor layer according to claim 11,
wherein the single crystal semiconductor substrate is a single crystal silicon substrate.

15. The method for manufacturing a single crystal semiconductor layer according to claim 11,
wherein the metal layer is formed by applying a material containing a metal.

16. The method for manufacturing a single crystal semiconductor layer according to claim 15,
wherein the material containing the metal is a material containing aluminum or copper.

* * * * *